(12) United States Patent
Burry et al.

(10) Patent No.: US 11,996,269 B2
(45) Date of Patent: May 28, 2024

(54) EXTREMUM SEEKING CONTROL APPARATUSES WITH ONLINE PARAMETER ADJUSTMENT AND METHODS

(71) Applicant: MKS Instruments, Inc., Andover, MA (US)

(72) Inventors: Aaron Burry, Ontario, NY (US); Vladimir Kozitsky, Rochester, NY (US)

(73) Assignee: MKS Instruments, Inc., Andover, MA (US)

( * ) Notice: Subject to any disclaimer, the term of this patent is extended or adjusted under 35 U.S.C. 154(b) by 76 days.

(21) Appl. No.: 17/940,047

(22) Filed: Sep. 8, 2022

(65) Prior Publication Data

US 2024/0087850 A1   Mar. 14, 2024

(51) Int. Cl.
*H01J 37/32* (2006.01)
*H03K 5/00* (2006.01)

(52) U.S. Cl.
CPC .... *H01J 37/32183* (2013.01); *H03K 5/00006* (2013.01); *H01J 2237/327* (2013.01)

(58) Field of Classification Search
CPC ................................................ H01J 37/32183
USPC ......................................................... 327/113
See application file for complete search history.

(56) References Cited

U.S. PATENT DOCUMENTS

| | | | |
|---|---|---|---|
| 7,602,127 B2 | 10/2009 | Coumou | |
| 8,110,991 B2 | 2/2012 | Coumou | |
| 8,395,322 B2 | 3/2013 | Coumou | |
| 8,674,606 B2 | 3/2014 | Carter et al. | |
| 10,049,857 B2 | 8/2018 | Fisk, II et al. | |
| 10,546,724 B2 | 1/2020 | Radomski et al. | |
| 10,741,363 B1* | 8/2020 | Burry | H03H 7/40 |
| 10,821,542 B2 | 11/2020 | Nelson et al. | |
| 2017/0054418 A1 | 2/2017 | Coumou et al. | |
| 2017/0062187 A1 | 3/2017 | Radomski et al. | |

FOREIGN PATENT DOCUMENTS

KR    10-2013-0071292 A    6/2013

OTHER PUBLICATIONS

International Search Report and Written Opinion regarding International Patent Application No. PCT/US2023/016908, dated Jul. 24, 2023.

* cited by examiner

*Primary Examiner* — Tomi Skibinski

(57) ABSTRACT

A power supply system includes a RF power source configured to generate an output signal at an output frequency, a signal source configured to generate a perturbation signal, an extremum seeking frequency controller configured to generate a frequency control signal based on the perturbation signal, and a frequency selector configured to select a perturbation frequency of the perturbation signal that is isolated from at least one frequency tone associated with the power supply system. The frequency control signal varies the output frequency of the RF power source. Other example power supply system, methods for controlling a RF generator, and control systems for controlling a RF generator are also disclosed.

60 Claims, 19 Drawing Sheets

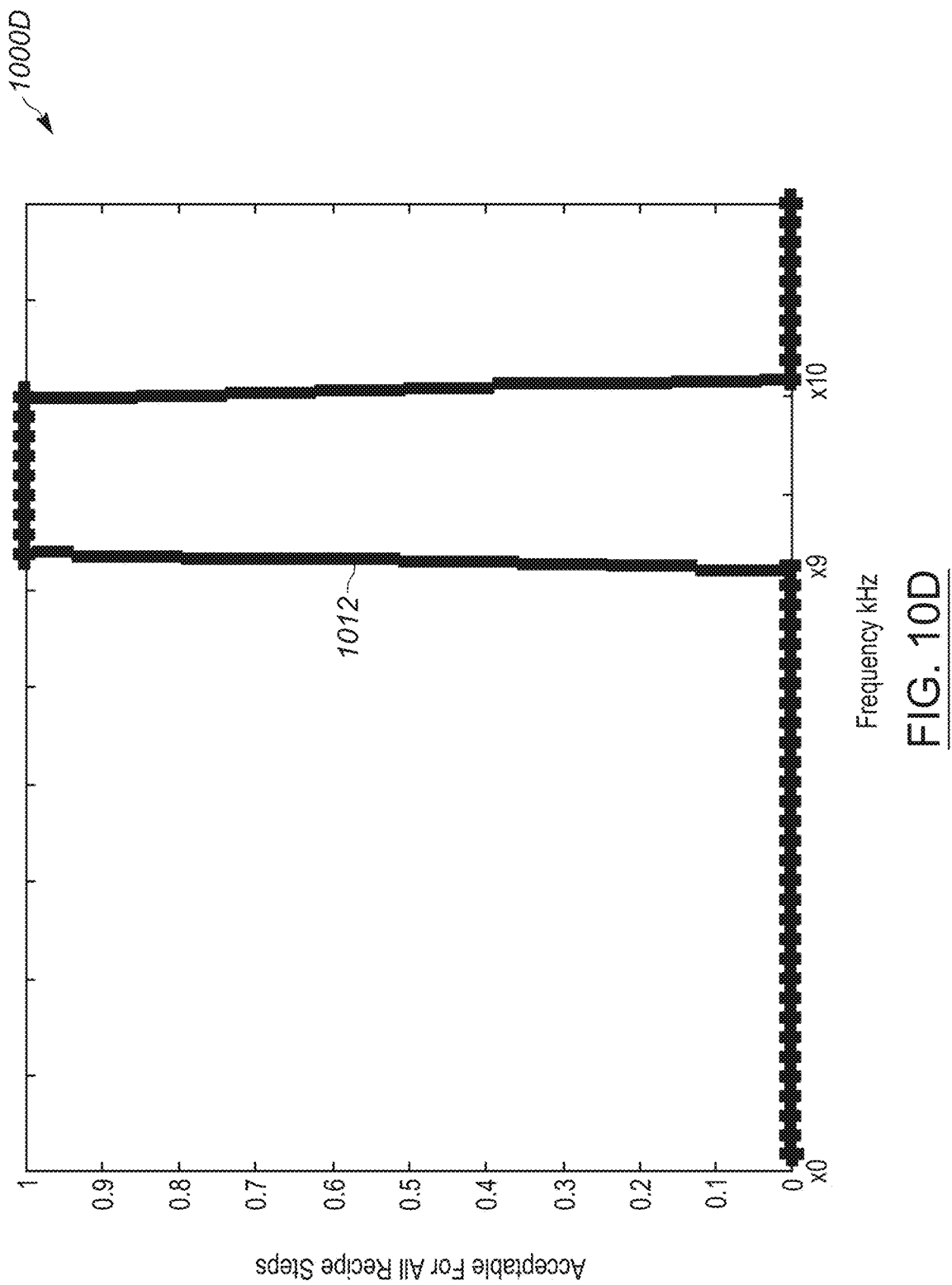

EXTREMUM SEEKING CONTROL APPARATUSES WITH ONLINE PARAMETER ADJUSTMENT AND METHODS

FIELD

The present disclosure relates to RF generator systems and to control of RF generators.

BACKGROUND

Plasma processing is frequently used in semiconductor fabrication. In plasma processing, ions are accelerated by an electric field to etch material from or deposit material onto a surface of a substrate. In one basic implementation, the electric field is generated based on Radio Frequency (RF) or Direct Current (DC) power signals generated by a respective RF or DC generator of a power delivery system. The power signals generated by the generator must be precisely controlled to effectively execute plasma etching.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. According to one aspect of the present disclosure, a power supply system for powering a load is disclosed. The power supply system includes a RF power source configured to generate an output signal at an output frequency, a signal source configured to generate a perturbation signal, an extremum seeking frequency controller configured to generate a frequency control signal based on the perturbation signal, and a frequency selector configured to select a perturbation frequency of the perturbation signal that is isolated from at least one frequency tone associated with the power supply system. The frequency control signal varies the output frequency of the RF power source. Other embodiments of this aspect include corresponding computer systems, apparatus, and computer programs recorded on one or more computer storage devices, each configured to perform the actions of the methods.

Implementations may include one or more of the following features. The power supply system may include a power controller coupled to the RF power source, where the power controller is configured to generate a pulse to modulate the output signal of the RF power source, and where the pulse includes a first state and a second state. The frequency selector may be configured to select a first perturbation frequency for the first state of the pulse and a second perturbation frequency for the second state, where the first perturbation frequency and the second perturbation frequency are different. The frequency selector may be configured to select the perturbation frequency for the first state and the second state of the pulse. The power supply system may include a power controller coupled to the RF power source, where the power controller is configured to generate at least two pulses to modulate the output signal of the RF power source, where each pulse includes a first state and a second state, where the frequency selector is configured to select a first perturbation frequency for the first state of each of the at least two pulses and a second perturbation frequency for the second state of each of the at least two pulses, and where the first perturbation frequency and the second perturbation frequency are different. The power supply system may include a power controller coupled to the RF power source, where the power controller is configured to generate a pulse to modulate the output signal of the RF power source, and where the frequency selector is configured to select the perturbation frequency based on a bandwidth of the power controller. The frequency selector may be configured to determine a first delta between a minimum value of the bandwidth and the at least one frequency tone and a second delta between the at least one frequency tone and a maximum value of the bandwidth, and select the perturbation frequency to equal a frequency value within the larger of the first delta and the second delta. The frequency value may be a midpoint of the larger of the first delta and the second delta. The frequency selector may be configured to analyze data indicative of an operating parameter of the power supply system according to the selected perturbation frequency, and adjust the perturbation frequency within the larger of the first delta and the second delta if the operating parameter is below a defined threshold. The frequency selector may be configured to analyze data indicative of the operating parameter of the power supply system according to the adjusted perturbation frequency, and adjust the perturbation frequency again within the larger of the first delta and the second delta if the operating parameter is below the defined threshold. The frequency selector may be configured to determine the at least one frequency tone, where the at least one frequency tone may include an apparent frequency associated with a state of the pulse. The apparent frequency may be determined based on a duty cycle of the state, a repetition rate of the pulse, and a holdoff time associated with the state. The at least one frequency tone may include a first apparent frequency associated with a first state of a pulse and a second apparent frequency associated with a second state of the pulse, and the frequency selector may be configured to select the perturbation frequency for the first state and the second state that is isolated from the first apparent frequency and the second apparent frequency. The frequency selector may be configured to implement a transform to analyze data of one or more feedback signals and determine the at least one frequency tone based on the analyzed data. The frequency selector may be configured to select the perturbation frequency based on the analyzed data. The frequency selector may be configured to implement a transform to analyze data of one or more feedback signals based on an output response according to the perturbation frequency. The frequency selector may be configured to adjust the perturbation frequency based on the analyzed data. The data may be indicative of an operating parameter of the power supply system, and the frequency selector may be configured to adjust the perturbation frequency if the operating parameter is below a defined threshold. The frequency selector may be configured to analyze data indicative of the operating parameter of the power supply system according to the adjusted perturbation frequency, and adjust the perturbation frequency again if the operating parameter is below the defined threshold. Implementations of the described techniques may include hardware, a method or process, or computer software on a computer-accessible medium.

According to another aspect of the present disclosure, a method for controlling a RF generator of a power supply system includes selecting a perturbation frequency of a perturbation signal that is isolated from at least one frequency tone associated with the power supply system, generating the perturbation signal with the selected perturbation frequency, and generating a frequency control signal based on the perturbation signal, where the frequency control signal varies an output frequency of the RF power source. Other embodiments of this aspect include corresponding computer systems, apparatus, and computer programs recorded on one or more computer storage devices, each configured to perform the actions of the methods.

Implementations may include one or more of the following features. The method may include generating a pulse to modulate an output signal of the RF power source, where the pulse includes a first state and a second state, and where selecting the perturbation frequency includes selecting the perturbation frequency for the first state and the second state of the pulse or selecting a first perturbation frequency for the first state of the pulse and a second perturbation frequency for the second state that is different than the first perturbation frequency. The method may include generating at least two pulses to modulate an output signal of the RF power source, where each of the pulses includes a first state and a second state, and where selecting the perturbation frequency includes selecting a first perturbation frequency for the first state of each of the at least two pulses and a second perturbation frequency for the second state of each of the at least two pulses that is different than the first perturbation frequency. The method may include generating, with a power controller, a pulse to modulate an output signal of the RF power source, where selecting the perturbation frequency includes selecting the perturbation frequency based on a bandwidth of the power controller. The method may include determining a first delta between a minimum value of the bandwidth and the at least one frequency tone and a second delta between the at least one frequency tone and a maximum value of the bandwidth, and selecting the perturbation frequency to equal a frequency value within the larger of the first delta and the second delta. The frequency value may be a midpoint of the larger of the first delta and the second delta. The method may include analyzing data indicative of an operating parameter of the power supply system according to the selected perturbation frequency, and adjusting the perturbation frequency within the larger of the first delta and the second delta if the operating parameter is below a defined threshold. The method may include analyzing data indicative of the operating parameter of the power supply system according to the adjusted perturbation frequency, and adjusting the perturbation frequency again within the larger of the first delta and the second delta if the operating parameter is below the defined threshold. The method may include determining the at least one frequency tone, where the at least one frequency tone may include an apparent frequency associated with a state of a pulse, and where determining the at least one frequency tone includes determining the apparent frequency associated with the state of the pulse based on a duty cycle of the state, a replication rate of the pulse, and a holdoff time associated with the state. The method may include selecting the perturbation frequency for a first state and a second state of the pulse that is isolated from a first apparent frequency associated with the first state of the pulse and a second apparent frequency associated with the second state of the pulse. The method may include implementing a transform to analyze data of one or more feedback signals, and determining the at least one frequency tone based on the analyzed data. The method may include selecting the perturbation frequency based on the analyzed data. The method may include implementing a transform to analyze data of one or more feedback signals based on an output response according to the perturbation frequency. The method may include adjusting the perturbation frequency based on the analyzed data. The data may be indicative of an operating parameter of the power supply system and the method further may include adjusting the perturbation frequency if the operating parameter is below a defined threshold. The method may include analyzing data indicative of the operating parameter of the power supply system according to the adjusted perturbation frequency, and adjusting the perturbation frequency again if the operating parameter is below the defined threshold. Implementations of the described techniques may include hardware, a method or process, or computer software on a computer-accessible medium.

According to another aspect of the present of the present disclosure, a non-transitory computer-readable medium storing processor-executable instructions for controlling a RF generator of a power supply system is disclosed. The RF generator includes a RF power source. The instructions include selecting a perturbation frequency of a perturbation signal that is isolated from at least one frequency tone associated with the power supply system, generating the perturbation signal with the selected perturbation frequency, and generating a frequency control signal based on the perturbation signal, where the frequency control signal varies an output frequency of the RF power source. Other embodiments of this aspect include corresponding computer systems, apparatus, and computer programs recorded on one or more computer storage devices, each configured to perform the actions of the methods.

Implementations may include one or more of the following features. The instructions may include generating, with a power controller, a pulse to modulate an output signal of the RF power source, where selecting the perturbation frequency of the perturbation signal includes selecting the perturbation frequency based on a bandwidth of the power controller. The instructions may include determining a first delta between a minimum value of the bandwidth and the at least one frequency tone and a second delta between the at least one frequency tone and a maximum value of the bandwidth, where selecting the perturbation frequency of the perturbation signal includes selecting the perturbation frequency to equal a frequency value within the larger of the first delta and the second delta. The frequency value may be a midpoint of the larger of the first delta and the second delta. The instructions may include analyzing data indicative of an operating parameter of the power supply system according to the selected perturbation frequency, and adjusting the perturbation frequency within the larger of the first delta and the second delta if the operating parameter is below a defined threshold. The instructions may include analyzing data indicative of the operating parameter of the power supply system according to the adjusted perturbation frequency, and adjusting the perturbation frequency again within the larger of the first delta and the second delta if the operating parameter is below the defined threshold. The instructions may include determining the at least one frequency tone, where the at least one frequency tone includes an apparent frequency associated with a state of a pulse, and where determining the at least one frequency tone includes determining the apparent frequency associated with the state of the pulse based on a duty cycle of the state, a replication rate of the pulse, and a holdoff time associated with the state. The instructions may include determining the at least one frequency tone, where the at least one frequency tone includes a first apparent frequency associated with a first state of a pulse and a second apparent frequency associated with a second state of the pulse, and where selecting the perturbation frequency of the perturbation signal includes selecting the perturbation frequency for the first state and the second state that is isolated from the first apparent frequency and the second apparent frequency. The instructions may include implementing a transform to analyze data of one or more feedback signals based on an output response according to the perturbation frequency, where the data is indicative of an operating parameter of the power supply system. The instructions may include adjusting the perturbation frequency if the operating parameter is below a defined threshold. The instructions may include analyzing data indicative of the operating parameter of the power supply system according to the adjusted perturbation frequency, and adjusting the perturbation frequency again if the operating parameter is below the defined threshold. Implementations of the described techniques may include hardware, a method or process, or computer software on a computer-accessible medium.

According to another aspect of the present of the present disclosure, a control system for controlling a RF generator of a power supply system includes a signal source configured to generate a perturbation signal, an extremum seeking frequency controller configured to generate a frequency control signal based on the perturbation signal, and a frequency selector configured to select a perturbation frequency of the perturbation signal that is isolated from at least one frequency tone associated with the power supply system. The frequency control signal varies the output frequency of the RF power source. Other embodiments of this aspect include corresponding computer systems, apparatus, and computer programs recorded on one or more computer storage devices, each configured to perform the actions of the methods.

Implementations may include one or more of the following features. The control system may include a power controller configured to generate a pulse to modulate the output signal of the RF power source, where the pulse includes a first state and a second state, where the perturbation frequency is a first perturbation frequency, where the frequency selector may be configured to select the first perturbation frequency for the first state of the pulse and a second perturbation frequency for the second state, and where the first perturbation frequency and the second perturbation frequency are different. The control system may include a power controller configured to generate a pulse to modulate the output signal of the RF power source, where the pulse includes a first state and a second state, and where the frequency selector may be configured to select the perturbation frequency for the first state and the second state of the pulse. The control system may include a power controller configured to generate at least two pulses to modulate the output signal of the RF power source, where each of the at least two pulses includes a first state and a second state, where the perturbation frequency is a first perturbation frequency, where the frequency selector may be configured to select the first perturbation frequency for the first state of each of the at least two pulses and a second perturbation frequency for the second state of each of the at least two pulses, and where the first perturbation frequency and the second perturbation frequency are different. The control system may include a power controller configured to generate a pulse to modulate the output signal of the RF power source, where the frequency selector may be configured to select the perturbation frequency based on a bandwidth of the power controller. The frequency selector may be configured to determine a first delta between a minimum value of the bandwidth and the at least one frequency tone and a second delta between the at least one frequency tone and a maximum value of the bandwidth, and select the perturbation frequency to equal a frequency value within the larger of the first delta and the second delta. The frequency selector may be configured to determine the at least one frequency tone. The frequency selector may be configured to implement a transform to analyze data of one or more feedback signals, determine the at least one frequency tone based on the analyzed data, and select the perturbation frequency based on the at least one frequency tone. The frequency selector may be configured to implement a transform to analyze data of one or more feedback signals based on an output response according to the perturbation frequency, and adjust the perturbation frequency based on the analyzed data. The data may be indicative of an operating parameter of the power supply system, and the frequency selector may be configured to adjust the perturbation frequency if the operating parameter is below a defined threshold. Implementations of the described techniques may include hardware, a method or process, or computer software on a computer-accessible medium.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

FIGS. 9 and 10A-D show exemplary methods of selecting a perturbation frequency arranged in accordance with the principles of the present disclosure;

In the drawings, reference numbers may be reused to identify similar and/or identical elements.

DETAILED DESCRIPTION

Figure 1:
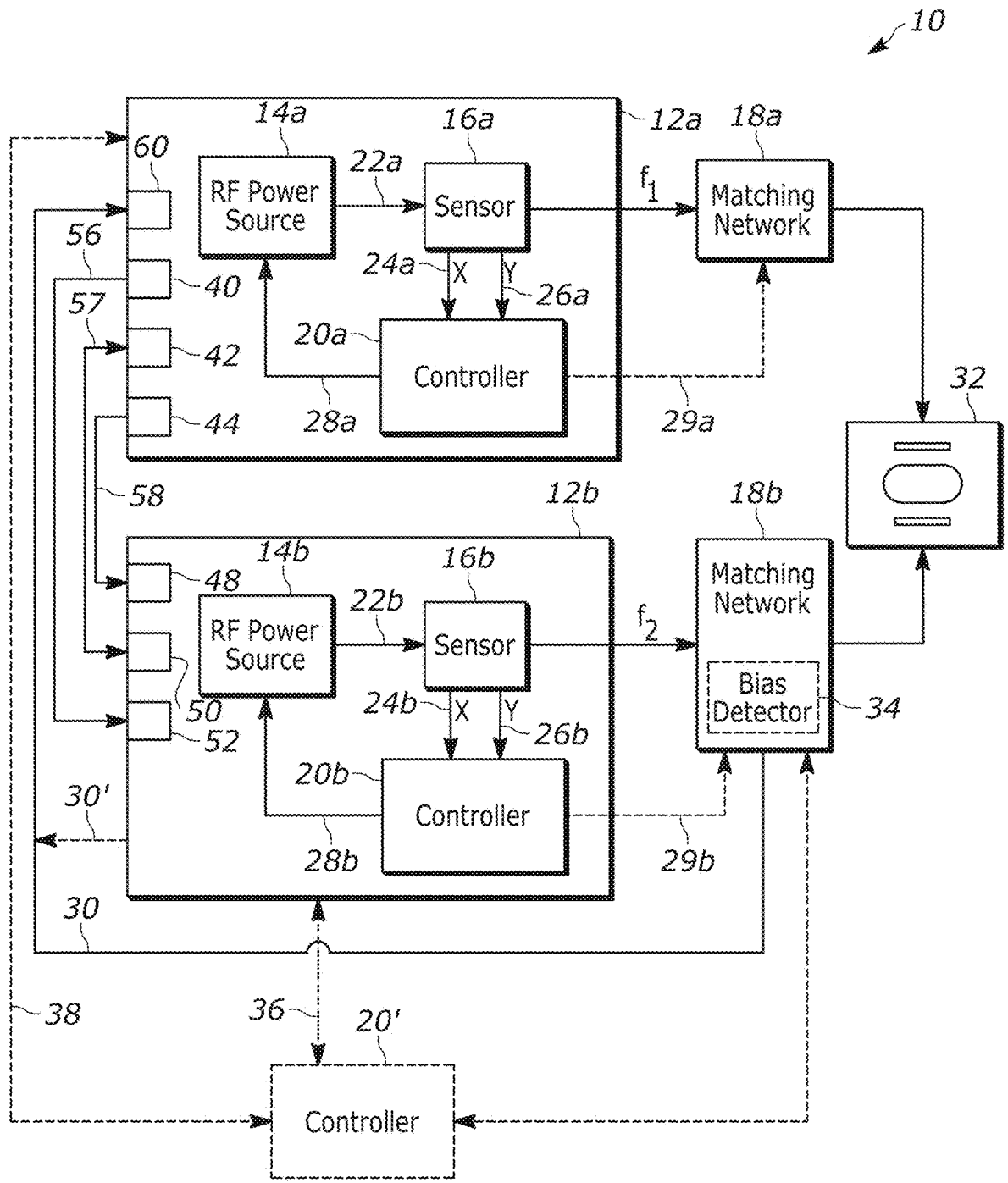
FIG. 1 is a schematic block diagram of a power delivery system having multiple power supplies arranged according to various configurations of the present disclosure.

A power system may include a DC or RF power generator or DC or RF generator, a matching network, and a load (such as a process chamber, a plasma chamber, or a reactor having a fixed or variable impedance). The power generator generates a DC or RF power signal, which is received by the matching network or impedance optimizing controller or circuit. The matching network or impedance optimizing controller or circuit matches an input impedance of the matching network to a characteristic impedance of a transmission line between the power generator and the matching network. The impedance matching aids in maximizing an amount of power forwarded to the matching network ("forward power") and minimizing an amount of power reflected back from the matching network to the power generator ("reverse power" or "reflected power"). Delivered power to the load may be maximized by minimizing reflected power when the input impedance of the matching network matches the characteristic impedance of the transmission line and generator.

In the power source or power supply field, there are typically two approaches to applying a power signal to the load. A first, more traditional approach is to apply a continuous power signal to the load. In a continuous mode or continuous wave mode, a continuous power signal is typically a constant DC or sinusoidal RF power signal that is output continuously by the power source to the load. In the continuous mode approach, the power signal assumes a constant DC or sinusoidal output, and the amplitude of the power signal and/or frequency (of a RF power signal) can be varied in order to vary the output power applied to the load.

A second approach to applying the power signal to the load involves pulsing a RF signal, rather than applying a continuous RF signal to the load. In a pulse or pulsed mode of operation, a RF signal is modulated by a modulation signal in order to define an envelope for the modulated power signal. The RF signal may be, for example, a sinusoidal RF signal or other time varying signal. Power delivered to the load is typically varied by varying the modulation signal.

In a typical power supply configuration, output power applied to the load is determined using sensors that measure the forward and reflected power or the voltage and current of the RF signal applied to the load. Either set of these signals is analyzed in a control loop. The analysis typically determines a power value which is used to adjust the output of the power supply in order to vary the power applied to the load. In a power delivery system where the load is a process chamber or other non-linear or time varying load, the varying impedance of the load causes a corresponding varying of power applied to the load, as applied power is in part a function of the impedance of the load.

In systems where fabrication of various devices relies upon introduction of power to a load to control a fabrication process, power is typically delivered in one of two configurations. In a first configuration, the power is capacitively coupled to the load. Such systems are referred to as capacitively coupled plasma (CCP) systems. In a second configuration, the power is inductively coupled to the load. Such systems are typically referred to as inductively coupled plasma (ICP) systems. Power coupling to the plasma can also be achieved via wave coupling at microwave frequencies. Such an approach typically uses Electron Cyclotron Resonance (ECR) or microwave sources. Helicon sources are another form of wave coupled source and typically operate at RF frequencies similar to that of conventional ICP and CCP systems. Power delivery systems may include at least one bias power and/or a source power applied to one or a plurality of electrodes of the load. The source power typically generates a plasma and controls plasma density, and the bias power modulates ions in the formulation of the sheath. The bias and the source may share the same electrode or may use separate electrodes, in accordance with various design considerations.

When a power delivery system drives a time-varying or non-linear load, such as a process chamber or plasma chamber, the power absorbed by the bulk plasma and plasma sheath results in a density of ions with a range of ion energy. One characteristic measure of ion energy is the ion energy distribution function (IEDF). The IEDF can be controlled with the bias power. One way of controlling the IEDF for a system in which multiple RF power signals are applied to the load occurs by varying multiple RF signals that are related by amplitude, frequency and phase. The relative amplitude, frequency, and phase of multiple RF power signals may also be related by a Fourier series and the associated coefficients. The frequencies between the multiple RF power signals may be locked, and the relative phase between the multiple RF signals may also be locked. Examples of such systems can be found with reference to U.S. Pat. Nos. 7,602,127; 8,110,991; and 8,395,322, all assigned to the assignee of the present application and incorporated by reference in this application.

Time varying or non-linear loads may be present in various applications. In one application, plasma processing systems may also include components for plasma generation and control. One such component is a non-linear load implemented as a process chamber, such as a plasma chamber or reactor. A typical plasma chamber or reactor utilized in plasma processing systems, such as by way of example, for thin-film manufacturing, can utilize a dual power system. One power generator (the source) controls the generation of the plasma, and the power generator (the bias) controls ion energy. Examples of dual power systems include systems that are described in U.S. Pat. Nos. 7,602,127; 8,110,991; and 8,395,322, referenced above. The dual power system described in the above-referenced patents employs a closed-loop control system to adapt power supply operation for the purpose of controlling ion density and its corresponding ion energy distribution function (IEDF).

Multiple approaches exist for controlling a process chamber, such as may be used for generating plasmas. For example, in RF power delivery systems, phase and frequency of multiple driving RF signals operating at the same or nearly the same frequency may be used to control plasma generation. For RF driven plasma sources, the periodic waveform affecting plasma sheath dynamics and the corresponding ion energy are generally known and are controlled by the frequency of the periodic waveforms and the associated phase interaction. Another approach in RF power delivery systems involves dual frequency control. That is, two RF frequency sources operating at different frequencies are used to power a plasma chamber to provide substantially independent control of ion and electron densities.

Another approach utilizes wideband RF power sources to drive a plasma chamber. A wideband approach presents certain challenges. One challenge is coupling the power to the electrode. A second challenge is that the transfer function of the generated waveform to the actual sheath voltage for a desired IEDF must be formulated for a wide process space to support material surface interaction. In one responsive approach in an inductively coupled plasma system, controlling power applied to a source electrode controls the plasma density while controlling power applied to the bias electrode modulates ions to control the IEDF to provide etch rate control. By using source electrode and bias electrode control, the etch rate is controlled via the ion density and energy.

As integrated circuit and device fabrication continues to evolve, so do the power requirements for controlling the process for fabrication. For example, with memory device fabrication, the requirements for bias power continue to increase. Increased power generates higher energetic ions for faster surface interaction, thereby increasing the etch rate and directionality of ions. In RF systems, increased bias power is sometimes accompanied by a lower bias frequency requirement along with an increase in the number of bias power sources coupled to the plasma sheath created in the plasma chamber. The increased power at a lower bias frequency and the increased number of bias power sources results in intermodulation distortion (IMD) emissions from a sheath modulation. The IMD emissions can significantly reduce power delivered by the source where plasma generation occurs. U.S. Pat. No. 10,821,542, issued Nov. 3, 2020 and entitled Pulse Synchronization by Monitoring Power in Another Frequency Band, assigned to the assignee of the present application and incorporated by reference herein, describes a method of pulse synchronization by monitoring power in another frequency band. In the referenced U.S. patent application, the pulsing of a second RF generator is controlled in accordance with detecting at the second RF generator the pulsing of a first RF generator, thereby synchronizing pulsing between the two RF generators.

FIG. 1 depicts a RF generator or power supply system 10. Power supply system 10 includes a pair of radio frequency (RF) generators or power supplies 12a, 12b, matching networks 18a, 18b, and load 32, such as a non-linear load, which may be a plasma chamber, plasma reactor, process chamber, and the like. In various configurations, RF generator 12a is referred to as a source RF generator or power supply, and matching network 18a is referred to as a source matching network. Also in various configurations, RF generator 12b is referred to as a bias RF generator or power supply, and matching network 18b is referred to as a bias matching network. It will be understood that the components can be referenced individually or collectively using the reference number with and without a letter, subscript, or a prime symbol.

In various configurations, source RF generator 12a receives a control signal 30 from matching network 18b and/or a control signal 30' from bias RF generator 12b. Control signal 30 or 30' represents an input signal to source RF generator 12a that indicates one or more operating characteristics or parameters of bias RF generator 12b. In various configurations, a synchronization bias detector 34 senses the RF signal output from matching network 18b to load 32 and outputs synchronization or trigger signal 30 to source RF generator 12a. In various configurations, synchronization or trigger signal 30' may be output from bias RF generator 12b to source RF generator 12a, rather than trigger signal 30. One difference between trigger or synchronization signals 30, 30' may result from the effect of matching network 18b, which can vary the phase between the input signal to and output signal from matching network. Signals 30, 30' include information about the operation of bias RF generator 12b that in various configurations enables predictive responsiveness to address periodic fluctuations in the impedance of load 32 caused by the bias RF generator 12b. When control signals 30 or 30' are absent, RF generators 12a, 12b operate autonomously.

RF generators 12a, 12b include respective RF power sources or amplifiers 14a, 14b, sensors 16a, 16b, and processors, controllers, or control modules 20a, 20b. RF power sources 14a, 14b generate respective RF power signals 22a, 22b output to respective sensors 16a, 16b. RF power signals 22a, 22b pass through sensors 16a, 16b and are provided to matching networks 18a, 18b as respective RF power signals $f_1$ and $f_2$. While sensors 16a, 16b, are shown within respective RF generators 12a, 12b, sensors 16a, 16b can be located externally to RF power generators 12a, 12b. Such external sensing can occur at the output of the RF generator, at the input of an impedance matching device located between the RF generator and the load, or between the output of the impedance matching device (including within the impedance matching device) and the load.

Sensors 16a, 16b detect various operating parameters and output signals X and Y. Sensors 16a, 16b may include voltage, current, and/or directional coupler sensors. Sensors 16a, 16b may detect (i) voltage V and current I and/or (ii) forward power $P_{FWD}$ output from respective power amplifiers 14a, 14b and/or RF generators 12a, 12b and reverse or reflected power $P_{REV}$ received from respective matching network 18a, 18b or load 32 connected to respective sensors 16a, 16b. The voltage V, current I, forward power $P_{FWD}$, and reverse power $P_{REV}$ may be scaled, filtered, or scaled and filtered versions of the actual voltage, current, forward power, and reverse power associated with the respective power sources 14a, 14b. Sensors 16a, 16b may be analog or digital sensors or a combination thereof. In a digital implementation, the sensors 16a, 16b may include analog-to-digital (A/D) converters and signal sampling components with corresponding sampling rates. Signals X and Y can represent any of the voltage V and current I or forward (or source) power $P_{FWD}$ reverse (or reflected) power $P_{REV}$.

Sensors 16a, 16b generate sensor signals X, Y, which are received by respective power controllers or control modules 20a, 20b. Control modules 20a, 20b process the respective X, Y signals 24a, 26a and 24b, 26b and generate one or a plurality of feedforward or feedback control signals 28a, 28b to respective power sources 14a, 14b. Power sources 14a, 14b adjust the RF power signals 22a, 22b based on the received one or plurality feedback or feedforward control signals. In various configurations, control modules 20a, 20b may control matching networks 18a, 18b, respectively, via respective control signals 29a, 29b based on, for example, X, Y signals 24a, 26a and 24b, 26b. In some configurations, control signals 29a, 29b may be the same as, similar to, or different than control signals 28a, 28b. Control modules 20a, 20b may include, at least proportional-integral (PI), proportional-integral-derivative (PID) controllers, linear-quadratic-regulator (LQR), or subsets thereof and/or direct digital synthesis (DDS) component(s) and/or any of the various components described below in connection with the modules.

In various configurations, control modules 20a, 20b may include functions, processes, processors, or submodules. Control signals 28a, 28b may be control or drive signals, may communicate DC offset or rail voltage, voltage or current magnitude, frequency, and phase components, etc. In various configurations, feedback control signals 28a, 28b can be used as inputs to one or multiple control loops. In various configurations, the multiple control loops can include a control loop for RF drive, and for rail voltage. In various configurations, control signals 28a, 28b can be used in a single-input-single-output (SISO) or a multiple-input-multiple-output (MIMO) control scheme. An example of a MIMO control scheme can be found with reference to U.S. Pat. No. 10,546,724, issued on Jan. 28, 2020, entitled Pulsed Bidirectional Radio Frequency Source/Load and assigned to the assignee of the present application, and incorporated by reference herein. In other configurations, signals 28a, 28b can provide feedforward control as described in U.S. Pat. No. 10,049,857, assigned to the assignee of the present application and incorporated by reference herein.

In various configurations, power supply system 10 can include controller 20'. Controller 20' may be disposed externally to either or both of RF generators 12a, 12b and may be referred to as external or common controller 20'. In various configurations, controller 20' may implement one or a plurality of functions, processes, or algorithms described herein with respect to one or both of controllers 20a, 20b. Accordingly, controller 20' communicates with respective RF generators 12a, 12b via a pair of respective links 36, 38 which enable exchange of data and control signals, as appropriate, between controller 20' and RF generators 12a, 12b. For the various configurations, controllers 20a, 20b, 20' can distributively and cooperatively provide analysis and control of RF generators 12a, 12b. In various other configurations, controller 20' can provide control of RF generators 12a, 12b, eliminating the need for the respective local controllers 20a, 20b.

In various configurations, RF power source 14a, sensor 16a, controller 20a, and matching network 18a can be referred to as source RF power source 14a, source sensor 16a, source controller 20a, and source matching network 18a. Similarly in various configurations, RF power source 14b, sensor 16b, controller 20b, and matching network 18b can be referred to as bias RF power source 14b, bias sensor 16b, bias controller 20b, and bias matching network 18b. In various configurations and as described above, the source term refers to the RF generator that generates a plasma, and the bias term refers to the RF generator that tunes the ion potential or IEDF of the plasma. In various configurations, the source and bias RF power supplies operate at different frequencies. In various configurations, the source RF power supply operates at a higher frequency than the bias RF power supply. In various other configurations, the source and bias RF power supplies operate at the same frequencies or substantially the same frequencies.

According to various configurations, source RF generator 12a and bias RF generator 12b include multiple ports to communicate externally. Source RF generator 12a includes pulse synchronization output port 40, digital communication port 42, and RF output port 44, and control signal port 60. Bias RF generator 12b includes RF input port 48, digital communication port 50, and pulse synchronization input port 52. Pulse synchronization output port 40 outputs pulse synchronization signal 56 to pulse synchronization input port 52 of bias RF generator 12b. Digital communication port 42 of source RF generator 12a and digital communication port 50 of bias RF generator 12b communicate via digital communication link 57. Control signal port 60 of source RF generator 12a receives control signal 30 and/or 30'. RF output port 44 generates RF control signal 58 input to RF input port 48. In various configurations, RF control signal 58 is substantially the same as the RF control signal controlling source RF generator 12a. In various other configurations, RF control signal 58 is the same as the RF control signal controlling source RF generator 12a, but is phase shifted within source RF generator 12a in accordance with a requested phase shift generated by bias RF generator 12b. Thus, in various configurations, source RF generator 12a and bias RF generator 12b are driven by substantially identical RF control signals or by substantially identical RF control signal phase shifted by a predetermined amount.

Figure 2:
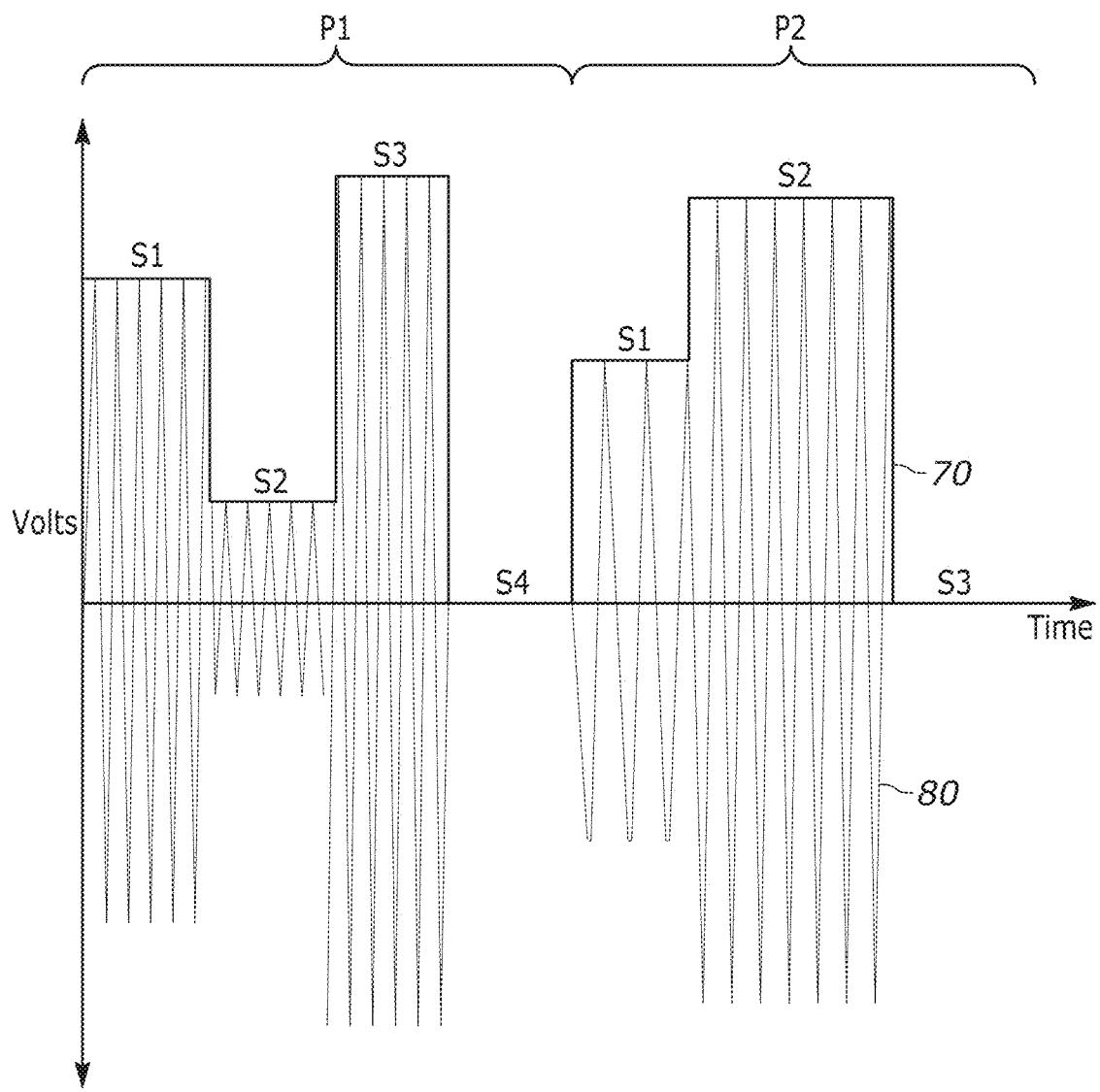
FIG. 2 shows waveforms of a RF signal and a pulse modulating the RF signal to describe a pulse mode of operation.

FIG. 2 depicts a plot of voltage versus time to describe a pulse or pulsed mode of operation for delivering power to a load, such as load 32 of FIG. 1. More particularly, FIG. 2 depicts two-multistate pulses P1, P2 of a pulse signal 70 having a respective plurality of states S1-S4 and S1-S3. In FIG. 2, RF signal 80 is modulated by pulses P1 and P2. As shown at states S1 of P1 and S1 of P2, when the pulses are ON, RF generator 12 outputs RF signal 80 having an amplitude defined by the pulse magnitude at each state. Conversely, during states S4 of P1 and S3 of P2, the pulses are OFF, and RF generator 12 does not output RF signal 80. Pulses P1, P2 can repeat at a constant duty cycle or a variable duty cycle, and states S1-S4, S1-S3 of each pulse P1, P2 may have the same or varying amplitudes and widths. Further, pulse signal 70 need not be a square wave as shown in FIG. 2. By way of non-limiting example, pulse signal 70 may be trapezoidal, triangular, gaussian, or other shape. Further yet, pulses P1, P2 can have multiple states S1, ..., Sn of varying amplitude, duration, and shape. States S1, ..., Sn may repeat within a fixed or variable period. Also shown in FIG. 2, RF signal 80 operates at a frequency that varies between states or within a state.

In a typical RF power delivery system, matching network (e.g., matching network 18a of FIG. 1) is adjusted to achieve maximum power delivery to load via tunable mechanical components. The maximum power delivery is indicative of a minimum reflected power. Because the response times of the electro-mechanical tuning elements in matching network are comparatively slow, adjustment of matching network may take a relatively extended period to complete the power adjustment. To improve impedance matching, the RF frequency output by power amplifier (e.g., power amplifier 14a of FIG. 1) may also be adjusted. Frequency-based tuning improves performance and provides responsiveness several orders of magnitude faster than adjustment of electro-mechanical components of matching network.

When employing frequency-based impedance matching, it is desirable to find an optimal frequency that provides minimum reflected power. The minimum reflected power may be indicated through a minimum magnitude of the measured complex reflection coefficient gamma, $|\Gamma|$. There are a number of existing methods for adjusting the RF frequency.

For example, automated frequency tuning is a standard approach for high-speed impedance matching. By adjusting the RF carrier frequency, the RF generator steers toward lower reflected power and compensates for transients in the load, even at pulse state change boundaries. Examples of automated frequency tuning methods include an extremum-seeking control (ESC) approach and a closed-form model based (such as a transfer function) approach. Examples of the ECS based approach for performing auto or automated frequency tuning can be found with reference to U.S. Pat. No. 10,741,363, assigned to the assignee of the present application and incorporated by reference in this application.

The ESC approach minimizes reflected power without requiring extensive knowledge of the process. The ESC approach implements a dynamic adjustment mechanism to auto tune the frequency along a direction of a gradient of a cost function without requiring an explicit model of the system or process. A cost function can be generally referred to as a functional equation that maps a set of points to a single scalar value. The scalar value that results from evaluation of a cost function can be referred to as a cost. For a frequency tuning application, this cost is sometimes associated with the magnitude of gamma squared or gamma mag squared ($|\Gamma|^2$) or an output response value such as delivered power. It is generally desirable to minimize or maximize the cost.

Figure 3A:
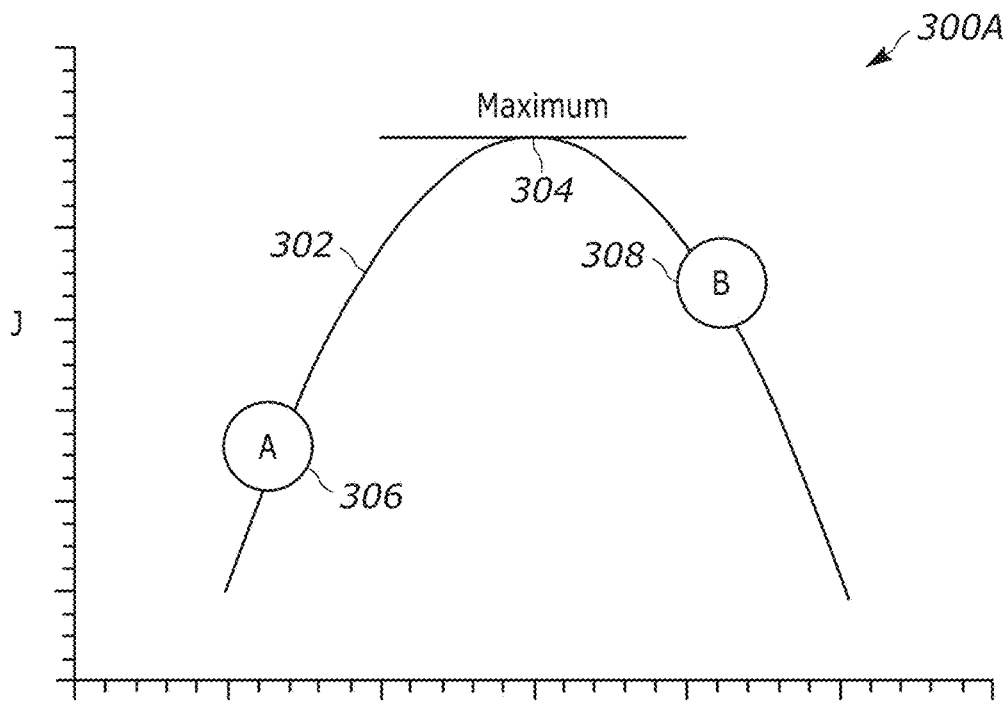
FIGS. 3A-B show plots of cost functions as a function of a cost and an actuator frequency.

For example, FIG. 3A depicts plot 300A of a quadratic cost function 302 as a cost function J (or gamma mag squared ($|\Gamma|^2$)) and an actuator frequency U. As shown, plot 300A includes a maximum 304 and positions 306, 308 along cost function 302, with each position 306, 308 being on different sides of maximum 304. Accordingly, all points to the left of maximum 304 have a positive slope (or gradient), and all points to the right of maximum 304 have a negative slope. If it is desirable to maximize cost J and actuator frequency is at position 306, actuator frequency may be increased thereby causing an increase in cost J (or the output response value). In other embodiments, if it is desirable to maximize cost J and actuator frequency is at position 308, actuator frequency may be decreased thereby causing an increase in cost J.

Figure 3B:
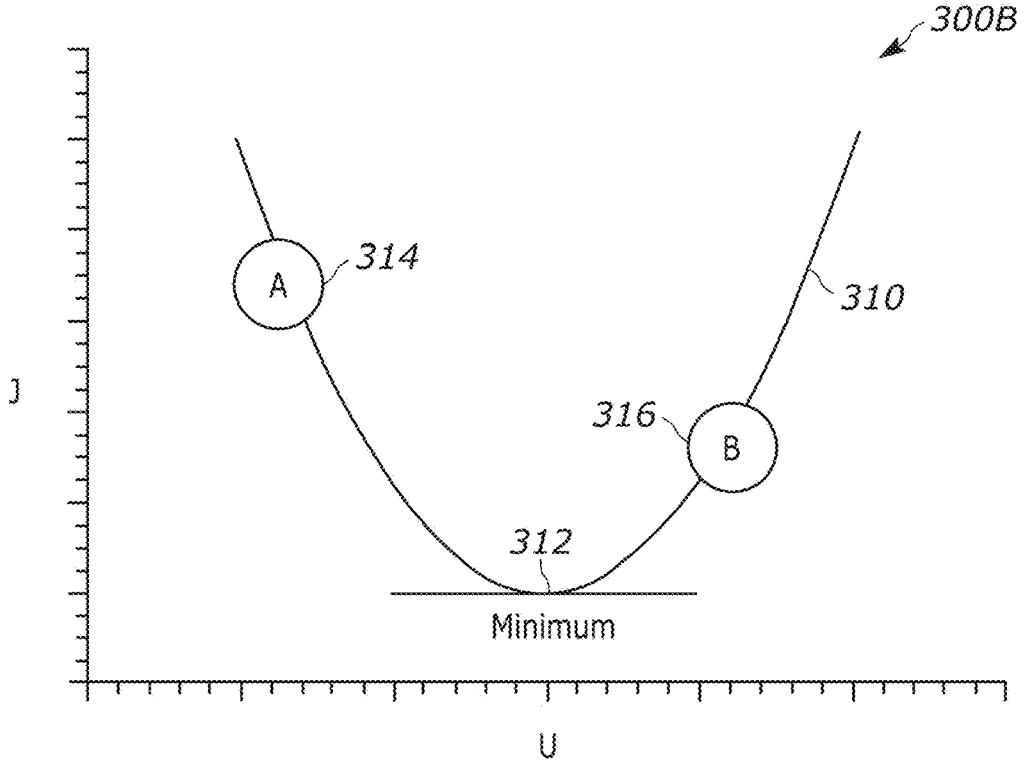

Similar relationships exist in connection with a quadratic cost function having a minimum. For example, FIG. 3B depicts plot 300B of a quadratic cost function 310 as a cost function J (or gamma mag squared ($|\Gamma|^2$)) and an actuator frequency U. As shown, plot 300B includes a minimum 312 and positions 314, 316 along cost function 310, with each position 314, 316 being on different sides of minimum 312. As such, in this example, all points to the left of minimum 312 have a negative slope, and all points to the right of minimum 312 have a positive slope. If it is desirable to minimize cost J and actuator frequency is at position 314, actuator frequency may be increased thereby causing a decrease in cost J (or the output response value). In other embodiments, if it is desirable to minimize cost J and actuator frequency is at position 316, actuator frequency may be decreased thereby causing a decrease in cost J.

To maximize or minimize cost J in FIGS. 3A-B, it is desirable to understand the directionality of actuator frequency U required to move the cost function towards a minimum or maximum value. In some ESC approaches, this may be accomplished by injecting a sinusoidal perturbation signal over multiple cycles on the actuator to probe the response of the system to a changing actuator frequency (e.g., change in the cost function). For example, based on the sinusoidal perturbation signal, the output response value changes, with its magnitude and direction depending on where its current position is (e.g., positions 306, 308, 314, 316 of FIGS. 3A-B) relative to a minimum or maximum point (e.g., maximum 304, minimum 312). The output response values may be processed to estimate a local slope (or gradient) of the cost function (e.g., cost function 302, 310), which in turn indicates a direction of actuator frequency adjustment required to move towards the minimum or maximum point. Examples of the ESC approach employing a sinusoidal perturbation signal can be found with reference to U.S. Pat. No. 10,741,363.

Figure 4:
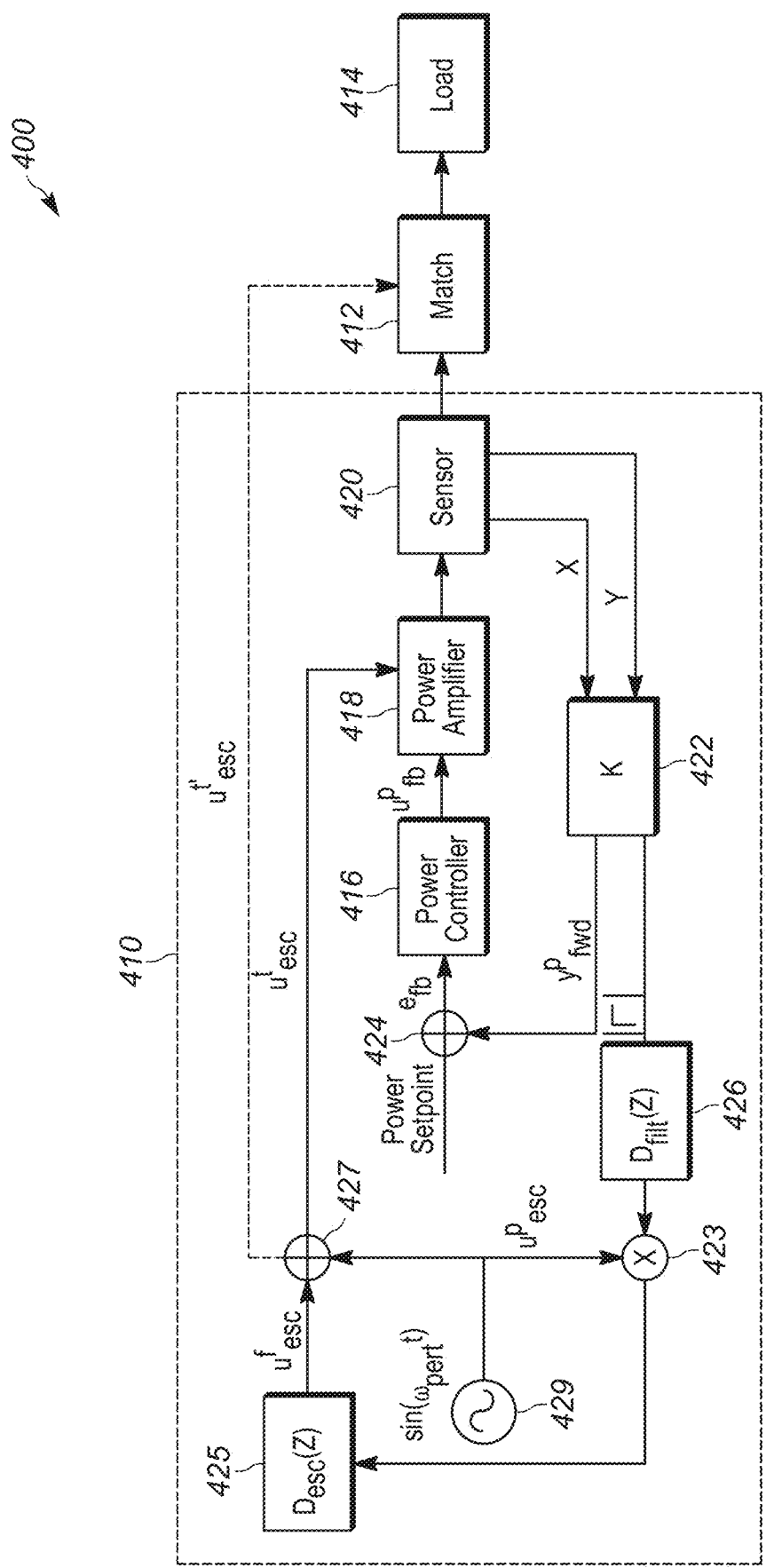
FIG. 4 shows a block diagram of a RF power delivery system implementing an extremum-seeking control (ESC) based approach.

FIG. 4 depicts one example of a power delivery system 400 including RF generator 410 implementing the ESC based approach. As shown, power delivery system 410 provides output to a match network 412, which in turn provides output to a load 414, such as non-linear load or plasma chamber. RF generator 410 includes a power controller 416, a power amplifier 418, and a sensor 420. Sensor 420 may be implemented as one of a voltage/current sensor (VI sensor) or a directional coupler, as described above. Power controller 416 outputs an actuation signal $u_{fb}^P$ input to power amplifier 418. The $u_{fb}^P$ signal represents a power control signal responsive to a feedback signal. Power amplifier 418 generates an output RF signal to sensor 420 as commanded by $u_{fb}^P$. Sensor 420 outputs the RF signal to match network 412 for application to load 414. Sensor 420 outputs feedback signals X, Y to block 422. In various embodiments, block 422 can be a scaling or calibration module that scales X and Y to output predetermined electrical parameters. Block 422 outputs a forward power value $y_{fwd}^P$ to summer 424. Summer 424 also receives a power setpoint input, and determines a difference (error $e_{fb}$) between the power setpoint input and the forward power value $y_{fwd}^P$. Error $e_{fb}$ is input to power controller 416. The error signal $e_{fb}$ input to power controller 416 determines a desired adjustment to $u_{fb}^P$ made by power controller 416 to power amplifier 418.

Block 422 also outputs the magnitude of the reflection coefficient $|\Gamma|$. The magnitude of the reflection coefficient $|\Gamma|$ is input to block 426 which implements a high pass filter with a transfer function $D_{filt}(z)$ to remove any DC bias. The filtered magnitude of $|\Gamma|$ is input to a mixer 423. Mixer 423 also receives a perturbation signal $u_{esc}^P$, generated by signal source 429. As shown, perturbation signal $u_{esc}^P$ is represented as a sinusoidal signal $\sin(\omega_{pert} t)$ and has a sinusoidal or perturbation frequency $\omega_{pert}$. Mixer 423 mixes the perturbation signal $u_{esc}^P$ and the measured magnitude of the complex coefficient $|\Gamma|$. The output of mixer 423 represents a scaled positive or negative square of the perturbation signal $u_{esc}^P$. The output from mixer 423 is input to an integrator $D_{esc}(z)$ 425 which generates a frequency control or frequency feedback signal $u_{esc}^f$ input to signal combiner or adder 427. Thus, the feedback signal $u_{esc}^f$ is combined with the perturbation signal $u_{esc}^P$ to generate a feedback component or a frequency control signal $u_{esc}^t$. The feedback component or frequency control signal $u_{esc}^f$ may be described below in Equation (1):

$$u_{esc}^t = u_{esc}^f + u_{esc}^P \qquad (1\text{I}1)$$

where:
$u_{esc}^f$ is a frequency tuning signal component to adjust the frequency to achieve auto-frequency tuning of the power delivery system, and
$u_{esc}^P$ is a perturbation signal component, which is the perturbation signal.

The $u_{esc}^t$ signal may be a complete frequency control signal (center frequency and AFT offset) or only an automatic frequency tuning (AFT) offset from the center frequency. In various non-limiting embodiments, if the center frequency of the system is 13.56 MHz, the $u_{esc}^t$ signal may represent an offset from 13.56 MHz to enable automatic frequency tuning or may be a desired output frequency, 13.58 MHz, for example.

In various other embodiments, adder 427 may output match control signal $u_{esc}^{t'}$ generated similarly to equation (1)

above to control operation of match network 412. In various other embodiments, signal $u'_{esc}$ can control one of an impedance tuning actuator, such as a reactive component embodied as a capacitor or inductor to vary a reactance of match network 412.

In various embodiments, signals generated in the system 400 may be corrupted by various signals or sources of noise having the same or similar frequency. For example, the perturbation signal used to generate the frequency control or frequency feedback signal $u_{esc}^{f}$ may be similar in frequency (and in some cases the same) as various other signals or sources of noise in the system. In turn, this may corrupt the ability of the system to measure or otherwise use the output response (or the output gamma mag squared) and/or other signals of interest. As such, it is desirable to select a frequency of the perturbation signal that is within a frequency spectrum without other strong signal content (e.g., other frequency tones). This allows for isolation of the resulting signals of interest, such that a local gradient of a cost function may be reliably and accurately measured.

One source of interference can come from a pulse train itself. For example, frequency tuners are usually stratified in that each tuner is receiving data relative to one state of a pulse (or pulses). Due to this, an "apparent" pulse frequency may be generated that moves around based on a pulsing setup. For instance, the apparent pulse frequency associated with each state may be calculated based on a duty cycle of the state, a repetition rate of the pulse, and a holdoff time associated with the state, as shown below in Equation (2):

$$F_{apparent} = \frac{1}{T_{Pulse} * \text{Duty Cycle} - \text{Holdoff\_Time}} \quad (2)$$

where:
$T_{Pulse}$ is the pulse period and is equal to one over the pulse repetition rate,
Duty Cycle is a percentage of a width of the state over the entire pulse, and
Holdoff_Time is a period of time in which a tuner is held idle at state transitions of the pulse.

For instance, for a 2 kHz pulse repetition rate, with 20% duty cycle for one of the pulse states and a 50 microsecond holdoff time, the tuner will see significant frequency content at 20 kHz (the apparent frequency) from the pulse train itself. If the duty cycle is changed from 20% to 15%, the apparent pulse frequency moves to 40 kHz.

Figure 5A:
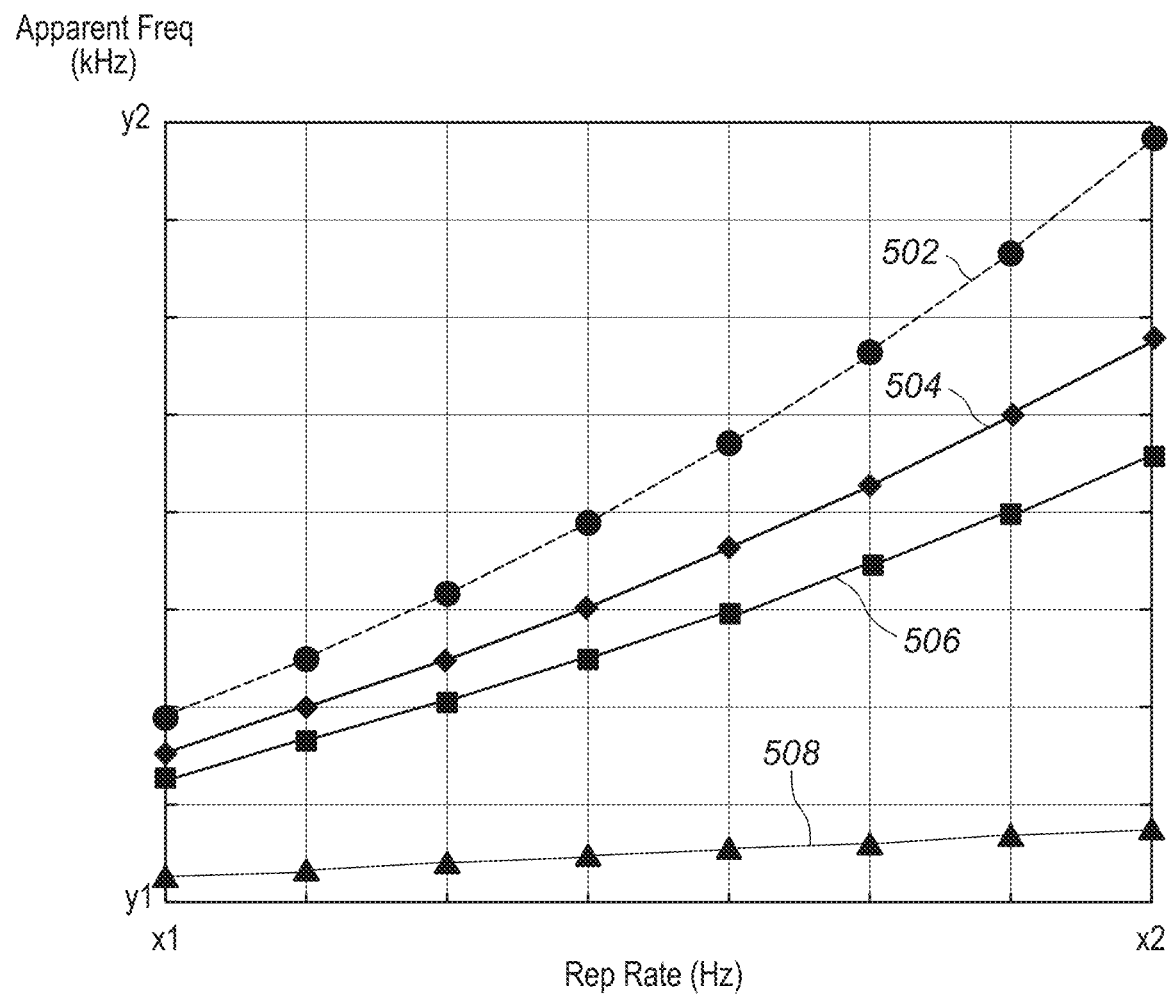
FIGS. 5A-B show plots of apparent pulse frequencies as a function of pulse repetition rates and duty cycles.
Figure 5B:
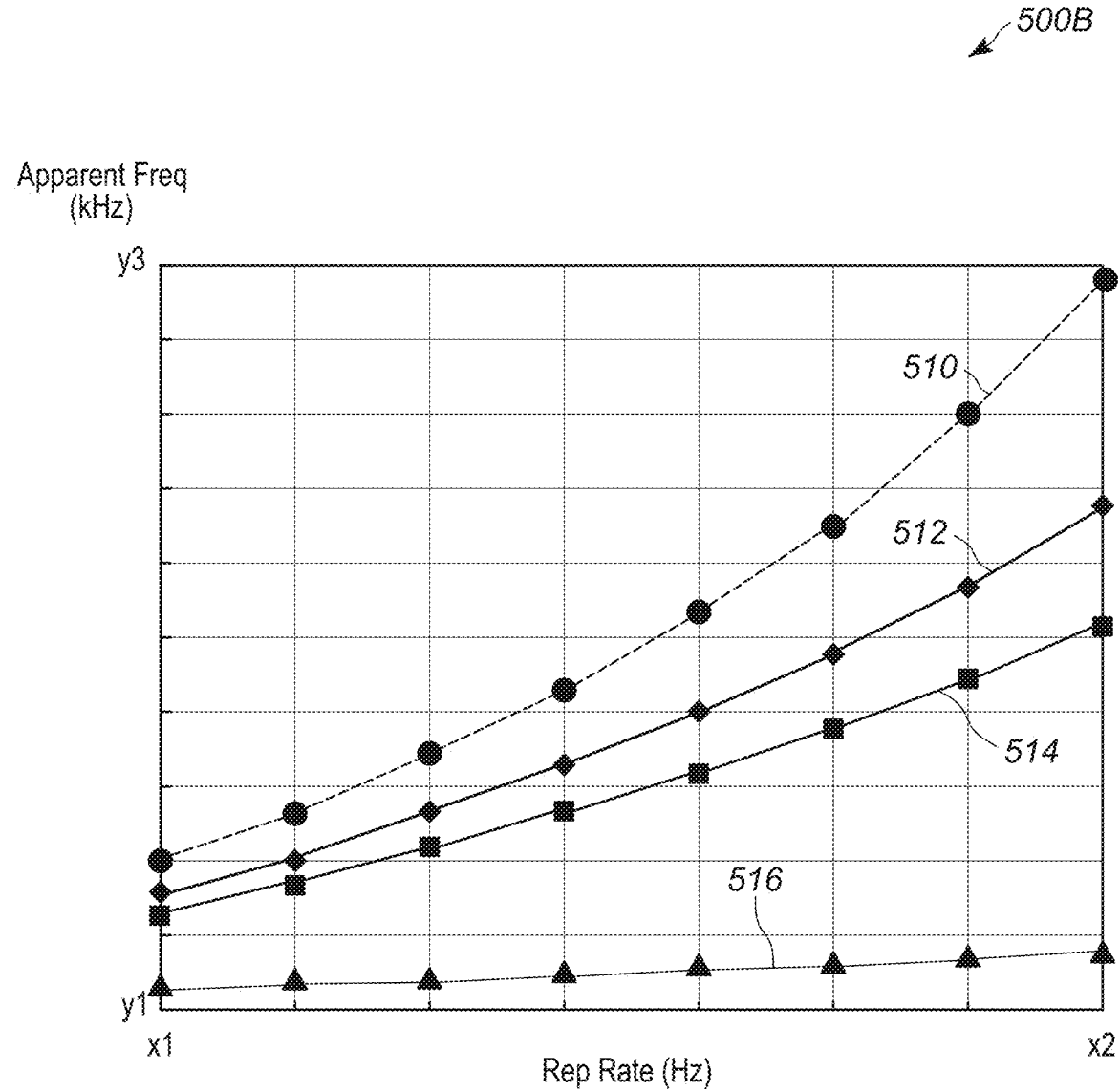

For example, FIGS. 5A-B depict plots 500A, 500B showing calculated apparent pulse frequencies (Y-axis) as a function of pulse repetition rates (X-axis), duty cycles, and holdoff times, in accordance with Equation (3) above. In the example of FIGS. 5A-B, the holdoff times are constant, with the holdoff time in FIG. 5A being shorter than the holdoff time in FIG. 5B, and the pulse repetition rates range between values X1, x2. Additionally, the apparent pulse frequency in FIG. 5A ranges between value y1 (e.g., 0 Hz) and value y2, and the apparent pulse frequency in FIG. 5B ranges between value y1 and value y3. In this example, value y3 of FIG. 5B is larger than value y2 of FIG. 5A. Each line 502, 504, 506, 508, 510, 512, 514, 516 of FIGS. 5A-B represents an apparent pulse frequency changing with respect to the pulse repetition rate, while implementing different duty cycles. For instance, lines 502, 510 represent the apparent pulse frequency as a function of the pulse repetition rate and a first duty cycle, lines 504, 512 represent the apparent pulse frequency as a function of the pulse repetition rate and a second duty cycle, lines 506, 514 represent the apparent pulse frequency as a function of the pulse repetition rate and a third duty cycle, and lines 508, 516 represent the apparent pulse frequency as a function of the pulse repetition rate and a fourth duty cycle.

As can be seen in FIGS. 5A-B, for many repetition rate and duty cycle combinations, the data suggest that a high perturbation frequency may be acceptable. However, if the repetition rate is moved, for example, to a higher rate, this perturbation frequency may be too close to the apparent pulse frequency and result in corruption of the desired gradient measurement. In fact, in various embodiments, the apparent pulse frequency may fall exactly at the perturbation frequency. Thus, while the data in FIGS. 5A-B may suggest that selecting a relatively higher perturbation frequency may provide some assurance of avoiding the pulse repetition rate effects, minor setup changes dramatically affect the resulting apparent pulse frequencies. Therefore, only minor changes to, for example, the holdoff time, the duty cycle, and/or the repetition rate may greatly affect the resulting apparent pulse frequencies and cause interference with the perturbation frequency.

Additionally, in some embodiments, selecting a high perturbation frequency causes other issues in the control system. For example, a frequency tuner is constantly modulating the load impedance with its sinusoidal perturbation signal, and a power controller such as the power controller 416 of FIG. 4 may rely on sensed parameters from the load for controlling a power amplifier. If the power controller (more specifically the power control loop) does not have sufficient bandwidth, then this disturbance will bleed through and affect the delivered power to the load. Thus, in many instances, the higher perturbation frequencies for a frequency tuning loop may result in the power control loop being less capable at rejecting this disturbance. This can be seen in FIG. 6.

Figure 6:
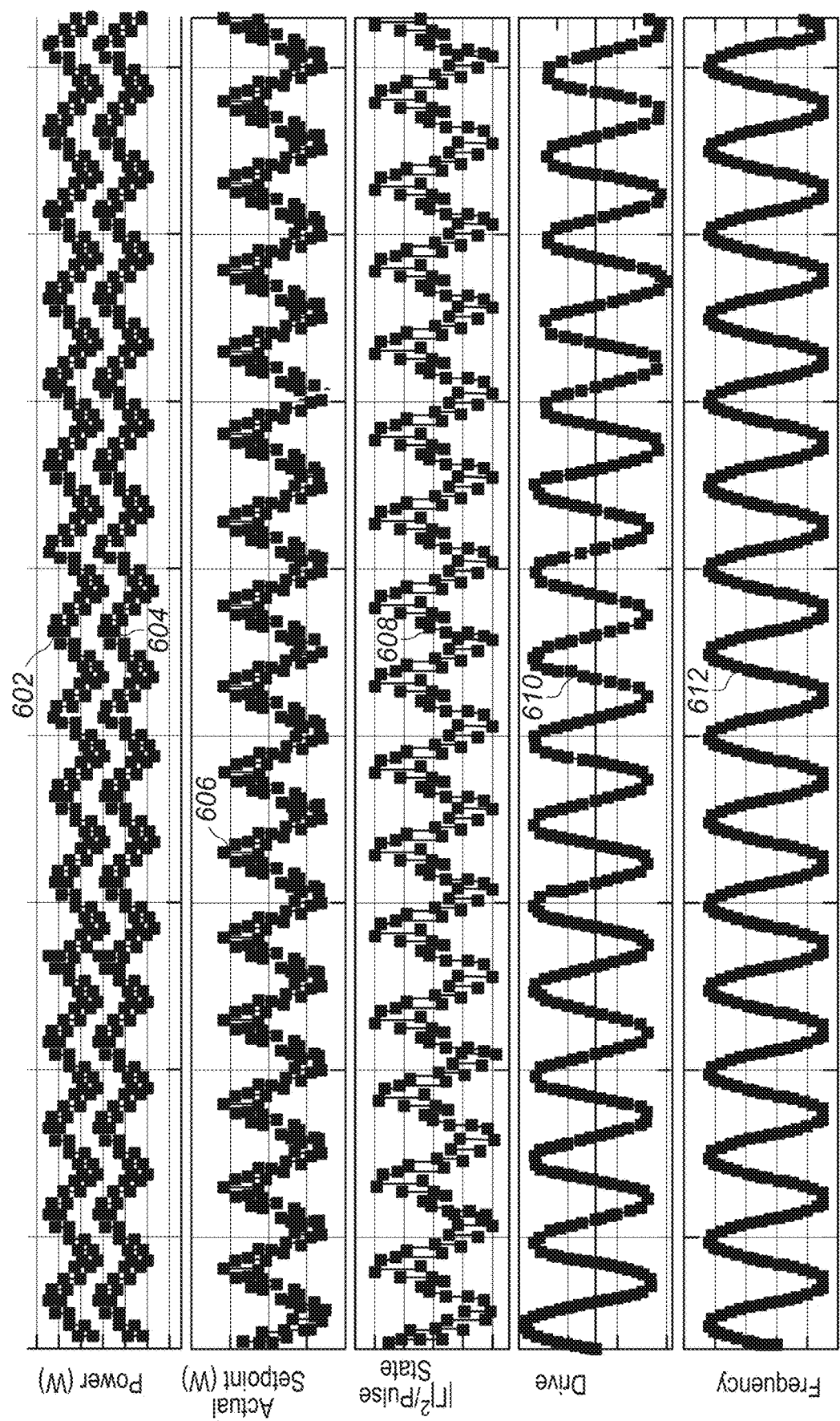
FIG. 6 shows a plot of various waveforms associated with an implemented sinusoidal frequency modulation signal.

For example, FIG. 6 depicts various waveforms 602, 604, 606, 608, 610, 612 representing forward power, measured delivered power, an actual power setpoint, gamma mag squared, a power drive signal, and a sinusoidal frequency modulation signal. As can be seen in FIG. 6, the effect of a 40 kHz sinusoidal frequency modulation (waveform 612) is clearly visible in the measured delivered power (waveform 604). For example, it is desirable to deliver constant power to the load. However, the 40 kHz sinusoidal frequency modulation causes a +/−5% delivered power variation (e.g., wiggle or ripple) to the delivered power. This is because the power control loop does not have sufficient bandwidth to handle the 40 kHz sinusoidal frequency modulation. If, however, the perturbation frequency is within the controller's bandwidth, the controller is able to compensate for the impedance fluctuations caused by the frequency tuning loop and maintain constant delivered power.

In view of the above, and as recognized by the inventors, it is desirable to select a perturbation frequency of the perturbation signal that meets various design constraints. For example, and as further explained herein, the perturbation frequency is in a window that avoids other signal content (frequencies) that would interfere with the gradient measurement. In other words, the selected perturbation frequency is isolated from other frequency tones in the system (e.g., frequency tones associated with a RF generator utilizing the perturbation signal, with other RF generators in the system, load components such as plasma chamber components, controllers in the system, etc.). Further, the perturbation frequency is small enough to avoid disturbances to the power control loop (e.g., less than a bandwidth limit)

and/or large enough to avoid low frequency content not associated with the perturbation signal.

The present disclosure provides various solutions for selecting and/or adjusting a perturbation frequency of a perturbation signal that meets one or more of these various design constraints. For example, the perturbation frequency may be dynamically selected, adjusted, etc. so that it is sufficiently isolated from other frequency tones such as an apparent pulse frequency, harmonics, etc. in the system, while being below a bandwidth limit of a power control loop. This may occur while the system is in use (e.g., online) rather than in a design phase and based on current operating conditions. By doing so, tuning performance for ESC-based automatic frequency tuning systems is improved in that signals of interest may be reliable and useable (e.g., not corrupted).

Additionally, and as further explained herein, a perturbation frequency may be selected for various scenarios. For instance, based on operating conditions, a single perturbation frequency may be selected for each state of a pulse, a single perturbation frequency may be selected for an entire pulse, a single perturbation frequency may be selected for each corresponding states of multiple pulses (e.g., one perturbation frequency for state S1 of each pulse, another perturbation frequency for state S2 of each pulse, etc.).

Figure 7:
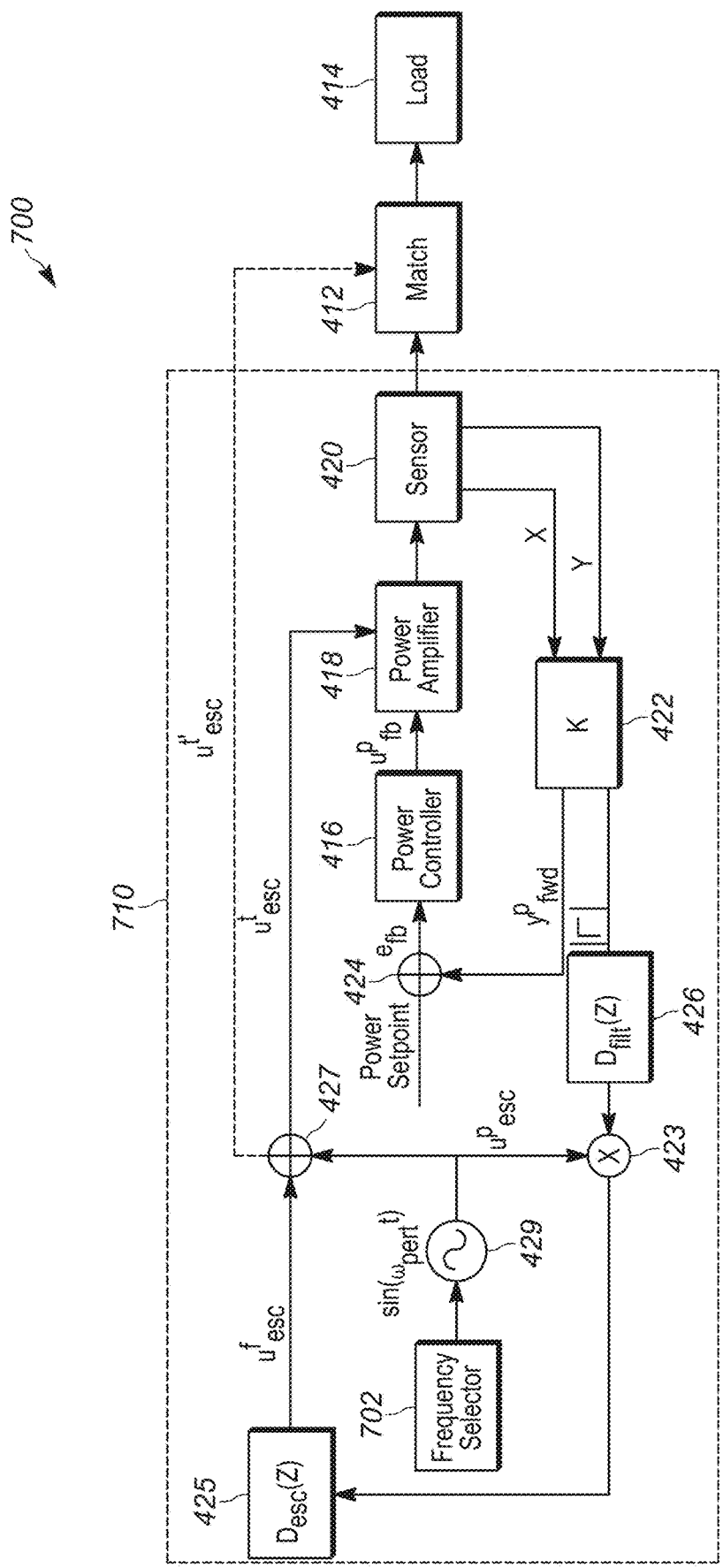
FIG. 7 shows a block diagram of a RF power delivery system arranged in accordance with the principles of the present disclosure.

FIG. 7 depicts one example of a power delivery system 700 including RF generator 710 implementing an ESC based approach, in which a perturbation frequency may be desirably selected in accordance with the teachings herein. As shown, power delivery system 700 includes match network 412 and load 414 of FIG. 4 and RF generator 710 for providing output to the load 414. RF generator 710 includes power controller 416, a power amplifier 418, sensor 420, control block 422 (e.g., including a scaling or calibration module), mixer 423, summer 424, control block 425 (e.g., including an integrator), control block 426 (e.g., including a high pass filter), signal combiner or adder 427, and perturbation signal source 429 of FIG. 4. These components function and interact in a similar manner as explained above. Additionally, the RF generator 710 includes a frequency selector control block (or module) 702 for selecting a desirable perturbation frequency of perturbation signal $u_{esc}^P$ generated by signal source 429.

According to various embodiments, various portions of RF generator 710 can be considered to cooperate to define a frequency controller such as an extremum seeking frequency controller. For example, in various embodiments, the frequency controller may include all or parts of mixer 423, control block 425, adder 427, perturbation signal source 429, and/or frequency selector block 702. In other embodiments, the frequency controller may include, for example, control block 425 and receive a perturbation signal-based signal from signal source 429. Additionally, according to various embodiments, various portions or all control elements of FIG. 7 can be implemented with a controller such as controller 20a, 20b, 20' of FIG. 1. For example, in FIG. 7, portions or all of power controller 416, control block 422, mixer 423, summer 424, control block 425, control block 426, adder 427, perturbation signal source 429 and/or frequency selector control block 702 may implemented as controller 20a, 20b, 20' of FIG. 1.

In various embodiments, frequency selector block 702 may determine one or more frequency tones associated with the RF generator 710 and/or other RF generators in system 700, and then select a perturbation frequency that is isolated from the frequency tone(s). For example, frequency selector block 702 may ingest or otherwise receive various known operating parameters, and then select a desirable perturbation frequency based on the operating parameters. For instance, operating parameters may include a pulse repetition rate, a state duty cycle, and/or a holdoff time associated with RF generator 710, operating frequencies associated with RF generator 710 and/or one or more other RF generators in system 700, harmonic aliases, etc. In various embodiments, operating frequencies of RF generators may generate a beat frequency tone (e.g., a difference between operating frequencies of RF generators). Based on this data or a portion thereof, frequency selector block 702 may calculate an apparent frequency (e.g., a frequency tone) associated with a particular state of a pulse as explained above, and then select an appropriate perturbation frequency to avoid that apparent frequency, any related frequencies (e.g., harmonics of the apparent frequency), and other frequency tones (e.g., a beat frequency tone). In other words, the perturbation frequency may be selected to ensure a robust separation from the apparent frequency, its related frequencies, and/or other known frequency tones.

The operating parameters may include information for a single state of a pulse, multiple states of a single pulse, for multiple states of multiple pulses, etc. As such, frequency selector block 702 may calculate or otherwise determine an apparent frequency associated with a single state in a pulse, and/or apparent frequencies associated with multiple states in a pulse (or multiple pulses) depending on the provided operating parameters. In some examples, the apparent frequency for one state may be the same or different than the apparent frequency for another state.

Once the apparent frequency for a single state or the apparent frequencies for multiple states are determined, frequency selector block 702 may select an appropriate perturbation frequency. For example, the frequency selector block 702 may select a single perturbation frequency for each different state in a pulse. This may be necessary, for example, if the determined apparent frequencies of multiple states are such that no suitable frequency is available to avoid each apparent frequency. In other examples, the same perturbation frequency may be selected and used in multiple states of a pulse (if possible), multiple corresponding states of multiple pulses (if possible), based on the operating parameters. For example, frequency selector block 702 may determine that multiple states in one or more pulses have apparent frequencies similar enough to allow the selection of a single perturbation frequency that avoids each of the apparent frequencies.

In other embodiments, and as further explained below, frequency selector block 702 may determine one or more frequency tones associated with the RF generator 710 based on measured feedback and analysis of that feedback. For instance, frequency selector block 702 may implement a transform (e.g., fast Fourier transform (FFT)) to analyze data of one or more feedback signals such as gamma mag squared, a reflective power, etc., and determine one or more frequency tones based on the analyzed data. Once the frequency tones are determined, frequency selector block 702 may select an appropriate perturbation frequency to avoid the frequency tones.

Additionally, in selecting the perturbation frequency, frequency selector block 702 may consider a bandwidth limit of power controller 416. For example, frequency selector block 702 may select a frequency that is below a known control bandwidth limit while also avoiding the frequency tones (e.g., an apparent pulse frequency for each state).

Figure 8A:
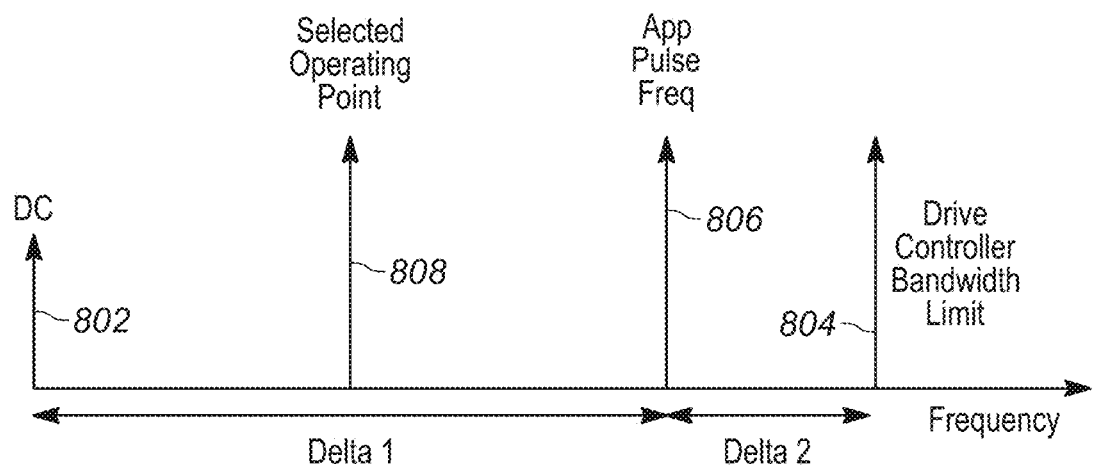
FIGS. 8A-B show exemplary methods of selecting a perturbation frequency based on a bandwidth of a power control loop arranged in accordance with the principles of the present disclosure.
Figure 8B:
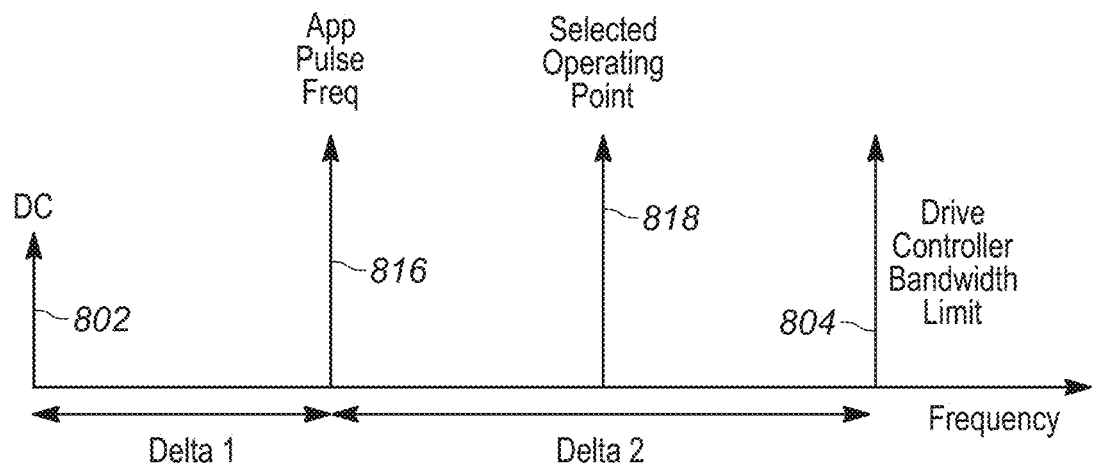

FIGS. 8A-B depict example methods of such a selection. For example, and as shown in FIGS. 8A-B, frequency selector block 702 may receive or otherwise determine a bandwidth limit 804 of a control loop such as the power control loop associated with power controller 416. After determining a frequency tone such as an apparent frequency, frequency selector block 702 may select an optimal perturbation frequency to avoid both the frequency tone and bandwidth limit 804.

For instance, in FIG. 8A, apparent frequency 806 is determined to be closer to bandwidth limit 804 than a DC value (0 Hz) 802 of the bandwidth. In other words, delta 1 between DC value 802 and apparent frequency 806 is larger than delta 2 between apparent frequency 806 and bandwidth limit 804. In such examples, frequency selector block 702 selects perturbation frequency 808 to fall within delta 1 (the larger of two deltas in FIG. 8A). In other words, perturbation frequency 808 is set to equal a frequency value or point within delta 1.

In FIG. 8B, however, apparent frequency 816 is determined to be closer to DC value 802 than bandwidth limit 804. As such, delta 2 between apparent frequency 816 and bandwidth limit 804 is larger than delta 1 between DC value 802 and apparent frequency 816. As such, in this example, frequency selector block 702 selects perturbation frequency 818 to fall in delta 2 (the larger of two deltas in FIG. 8B). In other words, perturbation frequency 818 is set to equal a frequency value or point within delta 2.

In various embodiments, frequency selector block 702 selects a perturbation frequency to fall at a midpoint of the larger delta. For example, in FIG. 8A, perturbation frequency 808 is selected so that it falls at a midpoint of delta 1, whereas in FIG. 8B, perturbation frequency 818 is selected so that it falls at a midpoint of delta 2. This may ensure the perturbation frequency is an adequate distance away from bandwidth limit 804, DC value 802, and apparent frequency 816. As such, this may ensure the perturbation frequency is small enough to avoid disturbances to the power control loop (e.g., less than a bandwidth limit), large enough to avoid low frequency content not associated with the perturbation signal, and isolated from the apparent frequency 816. Otherwise, if the perturbation frequency is too close to apparent frequency 816, the frequency controller may be unable to tune to minimum or maximum of a cost function (or gamma mag squared) and instead, tune to another, less desirable value.

In other embodiments, frequency selector block 702 may select another perturbation frequency that is not necessarily at a midpoint of the largest delta while still maintaining an adequate distance away from bandwidth limit 804, DC value 802, and apparent frequency 816. For example, frequency selector block 702 may select a lowest possible perturbation frequency in either delta (the larger or smaller delta) that is at least a minimum distance (e.g., +/−2.5 kHz, +/−5 kHz, etc.) from apparent pulse frequency 816 while also maintaining a defined distance (e.g., 5 kHz, 10 kHz, etc. depending on other frequency tones in the system, the value of the bandwidth limit, etc.) from DC value 802 or bandwidth limit 804.

In various embodiments, frequency selector block 702 may select an initial perturbation frequency to fall a certain point or frequency value (e.g., the midpoint, not at the midpoint, etc.) within one of the deltas 1, 2, and then adjust the perturbation frequency to another point or frequency value in the delta. For example, once the initial perturbation frequency is determined by frequency selector block 702, data from a feedback signal (e.g., gamma mag squared or another signal) may be observed and analyzed. If the feedback signal indicates an operating parameter of the system 700 and/or RF generator 710 satisfies a threshold (e.g., a wiggle of the delivered power is below a defined threshold, etc.), frequency selector block 702 may adjust the perturbation frequency to another point further away from, for example, apparent pulse frequency 816. The adjustment of the perturbation frequency may be repeated until the feedback signal indicates the threshold is not met (e.g., a wiggle of the delivered power is at the defined threshold). As such, in such examples, a distance from apparent pulse frequency 816 may be increased while still maintaining an adequate distance away from bandwidth limit 804, DC value 802.

In some embodiments, it may be desirable to use the same perturbation frequency for multiple pulse states. This may allow for reuse of some common elements (e.g., the high pass filter in the feedback loop) across multiple pulse states. As a result, improved efficiency of resource usage in some implementations such as FPGA implementations utilizing at least some common elements may be achieved. In these embodiments, a single perturbation frequency would then need to be selected.

For example, a known pulsing setup along with pulse state holdoffs could be analyzed to calculate the apparent pulse frequencies that would be seen by the tuner for each state. Using this information, a desired exclusion zone (e.g., a band of frequencies near each apparent pulse frequency) can be identified as regions of operation that should be avoided.

Figure 9:
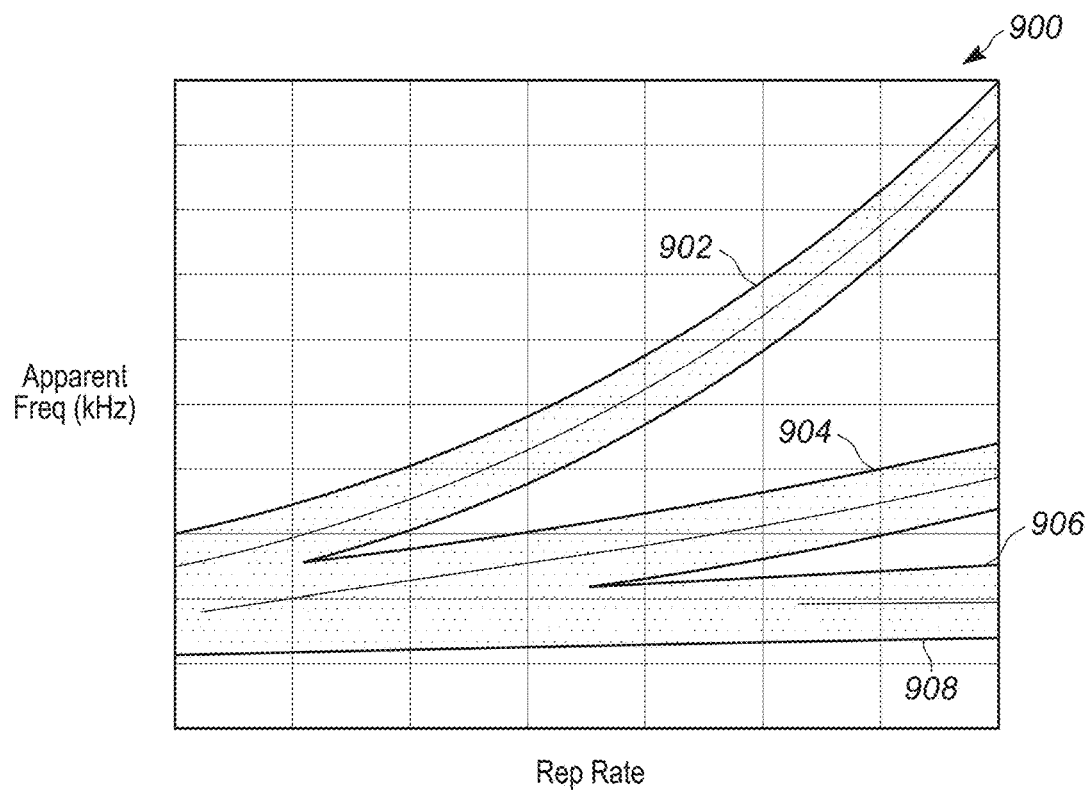

FIGS. 9-10 depict example methods of such a selection. For example, in FIG. 9, a plot 900 is depicted showing apparent pulse frequency curves for a pulsing configuration of a defined holdoff time, and pulse state duty cycles of four different values. As shown, an exclusion zone 902 is centered around the apparent pulse frequency curve at a first duty cycle value, an exclusion zone 904 is centered around the apparent pulse frequency curve at a second duty cycle value, an exclusion zone 906 is centered around the apparent pulse frequency curve at a third duty cycle value, and an exclusion zone 908 is centered around the apparent pulse frequency curve at a fourth duty cycle value. In this embodiment, each exclusion zone 902, 904, 906, 908 represents a 5 kHz region on each side of its corresponding apparent frequency curve.

Once the exclusion zones are identified, frequency selector block 702 may select a single perturbation frequency for multiple pulse states based on, for example, a pulse repetition rate. For example, the exclusion zones or regions of FIG. 9 may be overlaid with a particular pulse repetition rate to identify possible perturbation frequencies to avoid each of the exclusion zones or regions.

Figure 10A:
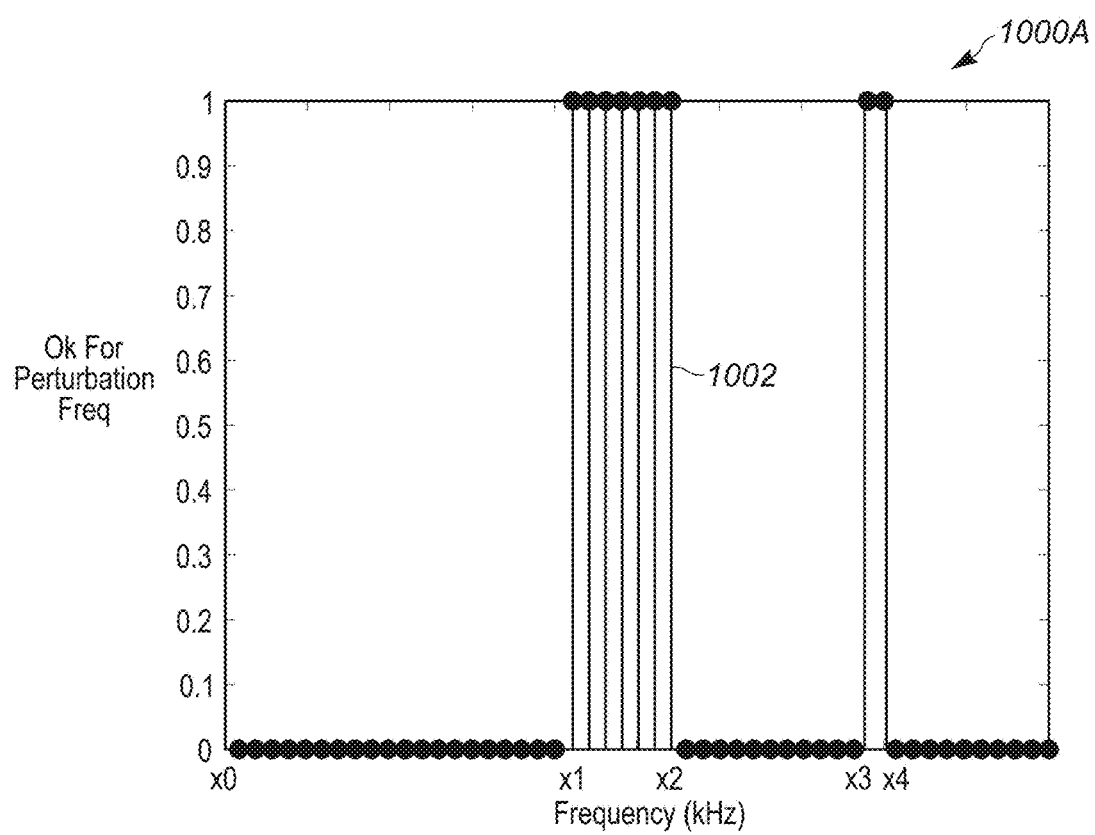

For example, FIG. 10A depicts a plot 1000A of a resulting overlay of the exclusion zones or regions of FIG. 9 with respect to a first pulse repetition rate. As shown, line 1002 has a value of zero from frequency value x0 (e.g., 0 Hz (DC)) to frequency value x1 indicating a perturbation frequency is not suitable in this region. This represents exclusion zones 908, 906, 904 of FIG. 9 at the first pulse repetition rate. Line 1002 then has a value of one from frequency value x1 to frequency value x2 indicating a perturbation frequency is suitable in this second region. This represents exclusion zones 904, 902 of FIG. 9. Line 1002 again has a value of zero from frequency value x2 to frequency value x3 indicating a perturbation frequency is not suitable in this region. This represents exclusion zone 902 of FIG. 9. Then, line 1002 again has a value of one from frequency value x3 to frequency value x4 indicating a perturbation frequency may be suitable in this region. This represents a region between exclusion zone 902 of FIG. 9 and a bandwidth limit of a power control loop. In such examples, frequency selector block 702 may identify the largest suitable region (e.g., between frequency values x1 and x2) and select a perturbation frequency in that region (e.g., at a midpoint between frequency values x1 and x2) for multiple pulse states having the first pulse repetition rate.

Figure 10B:
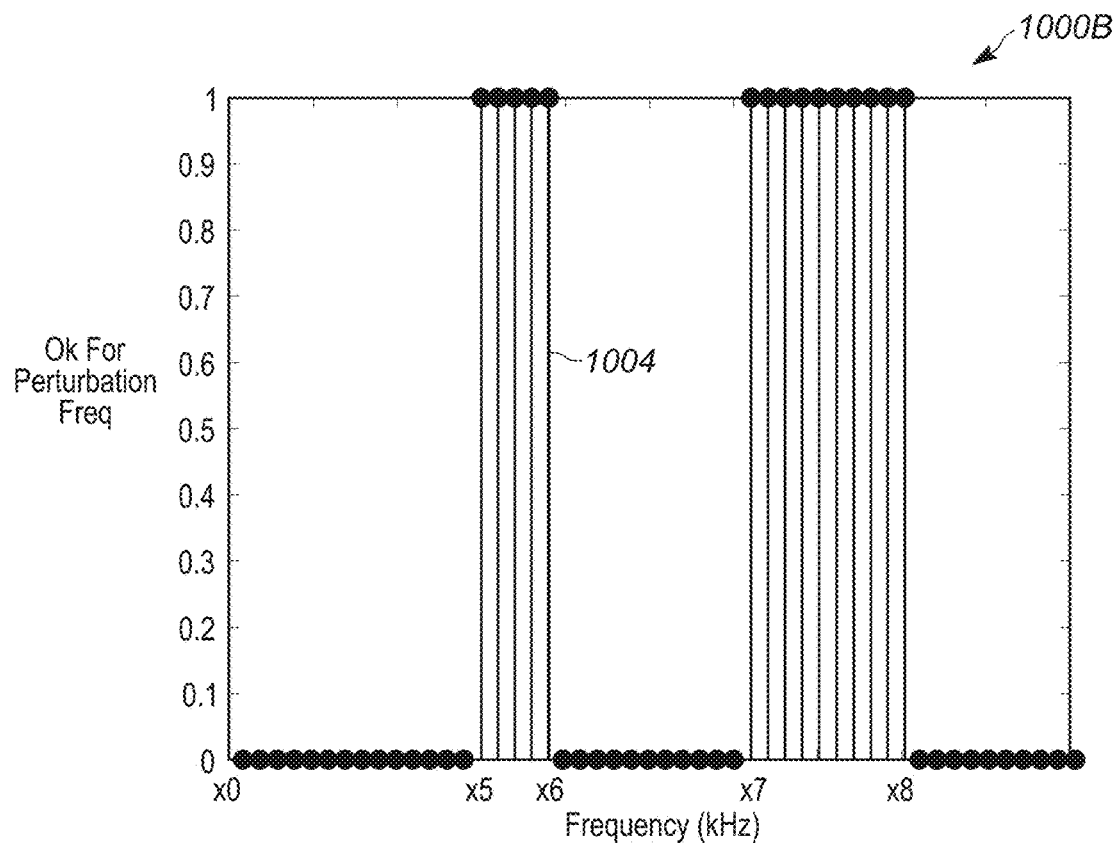

FIG. 10B depicts a plot 1000B similar to plot 100A, but with a resulting overlay of the exclusion zones or regions of FIG. 9 with respect to a second pulse repetition rate that is larger than the first pulse repetition rate. As shown, line 1004 has a value of zero from frequency value x0 (e.g., 0 Hz (DC)) to frequency value x5 (representing exclusion zones 908, 906 of FIG. 9 at the second pulse repetition rate), a value of one from frequency value x5 to frequency value x6 (representing a region between exclusion zones 906, 904), a value of zero from frequency value x6 to frequency value x7 (representing exclusion zone 904), and a value of one from frequency value x7 to frequency value x8 (representing a region between exclusion zone 904 and a bandwidth limit of a power control loop). In such examples, frequency selector block 702 again may identify the largest suitable region (between frequency values x7 and x8) and select a perturbation frequency in that region (e.g., at a midpoint between frequency values x7 and x8) for multiple pulse states having the second pulse repetition rate.

In various embodiments, frequency selector block 702 may take into account an entire set of pulsing conditions in order to select the most appropriate single perturbation frequency for multiple pulses. For instance, computing the logical AND of the two profiles shown in FIGS. 10A-B would indicate a particular operating perturbation frequency as being most appropriate.

Figure 10C:
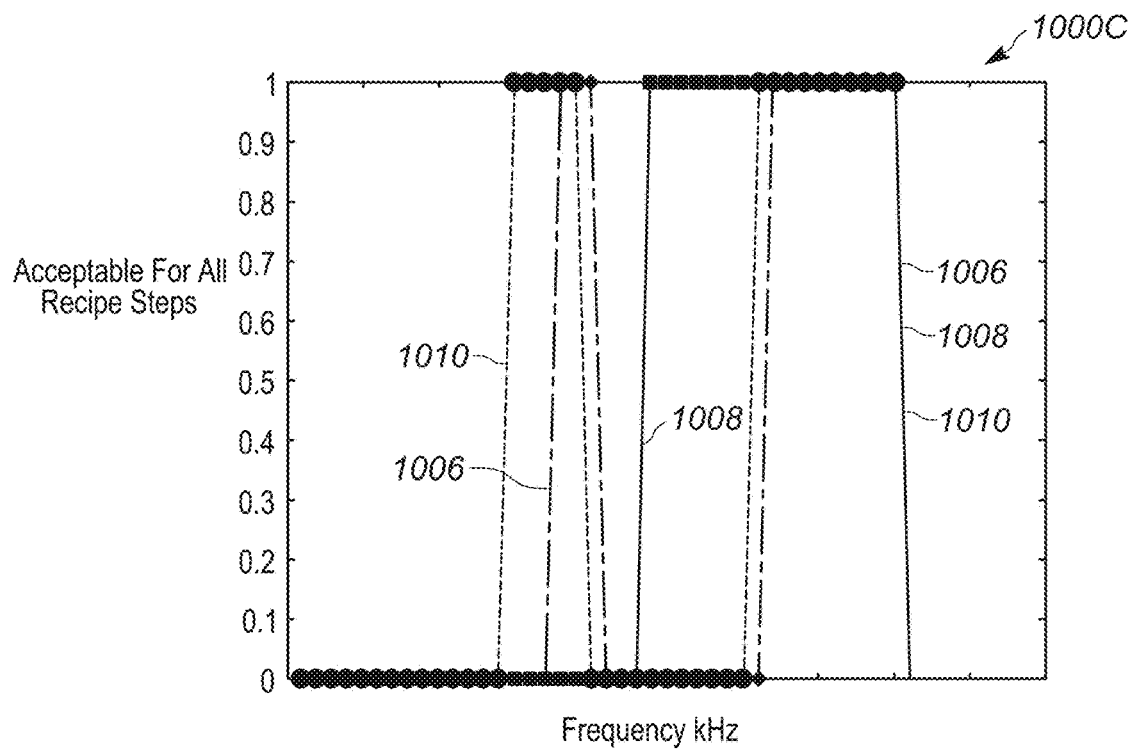

In various embodiments, the acceptable operating regions (or conversely the undesirable exclusion zones) may change with pulse repetition rate and duty cycles. For example, FIG. 10C depicts a plot 1000C of a resulting overlay of the exclusion zones or regions of FIG. 9 with respect to three different repetition rates (represented by lines 1006, 1008, 1010) and four different duty cycles of for four pulse states. Using data from plot 1000C, frequency selector block 702 may compute the logical AND of the three profiles shown in FIG. 10C to produce plot 1000D of FIG. 10D. As shown, plot 1000D includes line 1012 having a value of zero from frequency value x0 (e.g., 0 Hz (DC)) to frequency value x9 indicating an unsuitable region for a perturbation frequency and a value of one from frequency value x9 to frequency value x10 indicating a suitable region for a perturbation frequency. In such examples, frequency selector block 702 may select a perturbation frequency in the suitable region (e.g., at a midpoint between frequency values x9 and x10) for multiple pulses having any one of the three different pulse repetition rates.

In some cases, the overlapping constraints may not result in a single perturbation frequency across the entire set of pulses. As such, in such examples, frequency selector block 702 may iteratively identify a minimum set of suitable operational perturbation frequencies. In such scenarios, instead of computing the logical AND of the three profiles shown in FIG. 10C, frequency selector block 702 may compute a sum of the profiles. Frequencies that result in the largest sum total indicate frequencies that satisfy the most overlapping pulse constraints. By selecting a frequency with the largest sum, frequency selector block 702 may then exclude these pulsing conditions and recalculate the sum across the remaining (not included) pulsing conditions. As such, by selecting a frequency with the largest sum, frequency selector block 702 can iteratively identify a minimum set of perturbation frequencies required to satisfy all of the pulsing conditions in a given recipe.

In various embodiments, frequency selector block 702 may also take into account other frequency tones (e.g., other than apparent pulse frequencies) which may be present in the system when selecting a perturbation frequency. In other words, frequency selector block 702 may determine other frequency tones that should be avoided. For example, frequency selector block 702 may take into account a known harmonic alias for one of the RF frequencies (e.g., a harmonic of an apparent pulse frequency), a beat frequency that occurs between two RF carrier frequencies, and/or a perturbation frequency associated with another RF generator when, for example, the RF generators are pulsing in unison. These additional frequency tones could come in the form of single frequencies or exclusions zones (sets of frequencies to be avoided) as explained above. Using, for example, frequency selection methods described above, frequency selector block 702 can select appropriate perturbation frequencies that are isolated from (e.g., avoid) such frequency tones or constraints by selecting the perturbation frequencies via overlapping the constraints.

In some embodiments, potentially interfering signal content including apparent pulse frequencies and other frequency tones may be determined via an online frequency analysis. This may identify potentially unexpected signal content (e.g., strong harmonics) which could corrupt the gradient measurement. For instance, frequency selector block 702 may collect a set of feedback data (gamma mag squared, reflective power, etc.) across a given operational pulse, a state in a pulse, etc. and implement a transform (e.g., fast Fourier transform (FFT)) to analyze the data. Based on this transform analysis, frequency selector block 702 can determine possible interfering signal content (e.g., interfering frequency tones).

Figure 11A:
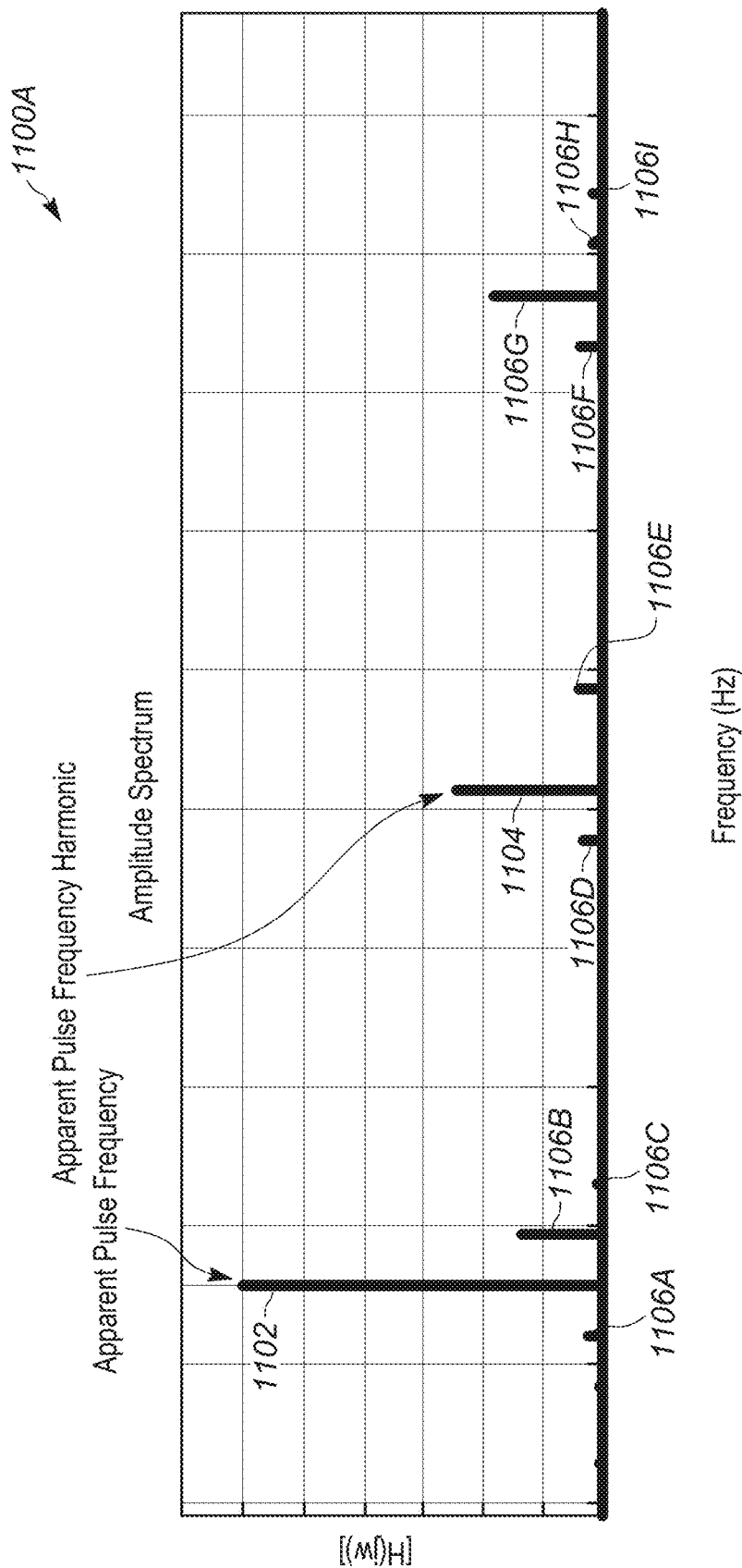
FIG. 11A-B show exemplary methods of selecting a perturbation frequency based on analyzed feedback data arranged in accordance with the principles of the present disclosure.

For example, FIG. 11A depicts a plot 1100A showing a spectrum of data (amplitude and frequency) for an operating condition based on feedback data analyzed with an FFT. As shown, the plot 1100A includes multiple potentially interfering frequency tones 1102, 1104, 1106A-I. Specifically, in FIG. 11A, frequency tone 1102 represents an identified apparent pulse frequency, frequency tone 1104 represents an identified harmonic of apparent pulse frequency 1102, and frequency tones 1106A-I represent other potentially interfering signals (which are unidentifiable). Once the potentially interfering signal content is determined, frequency selector block 702 may identify one or more suitable regions (e.g., the largest regions) between frequency tones 1102, 1104, 1106A-I, and then select a perturbation frequency for each state, multiple states in a pulse, or multiple corresponding states in multiple pulses in one of the regions. For instance, based on the determined signal content, frequency selector block 702 may select a perturbation frequency to fall within a region between frequency tones 1106C-D (e.g., at a midpoint between frequency tones 1106C-D) or within a region between frequency tones 1106E-F (e.g., at a midpoint between frequency tones 1106E-F).

Further, in some embodiments, a perturbation frequency may be initially selected (e.g., by frequency selector block 702) and frequency selector block 702 may collect and analyze (by implementing, for example, an FFT) a set of feedback data across a given operational pulse, a state in a pulse, etc. based on the output response of the perturbation frequency. In doing so, frequency selector block 702 may determine potentially interfering signal content near the perturbation frequency.

Figure 11B:
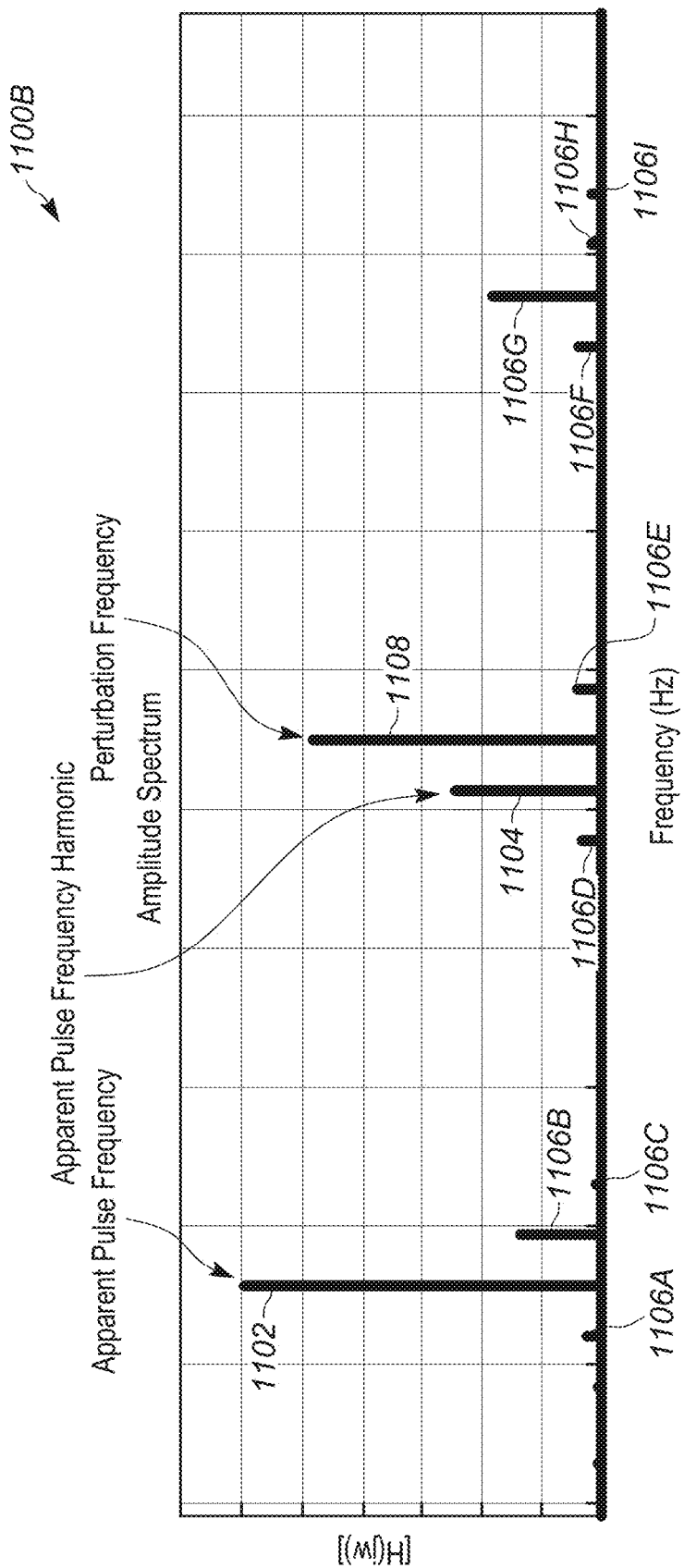

For example, FIG. 11B depicts a plot 1100B similar to plot 1100A of FIG. 11A, but showing a spectrum of data (amplitude and frequency) based on the output response of a selected perturbation frequency. Specifically, plot 1100B includes the frequency tones 1102, 1104, 1106A-I of FIG. 11A and perturbation frequency 1108. Based on the data in plot 1100B, it can be seen that perturbation frequency 1108 is located near multiple frequency tones such as tones 1104, 1106D, E. As such, in this example, frequency selector block 702 may select another perturbation frequency or adjust perturbation frequency 1108 based on the output response. For instance, and similar to FIG. 11A, frequency selector block 702 may select another perturbation frequency or adjust perturbation frequency 1108 to fall within a region between frequency tones 1106C-D or within a region between frequency tones 1106E-F. In various embodiments, a spectrum of data (amplitude and frequency) based on the output response of the newly selected perturbation frequency may created, to ensure that the new frequency does not strongly overlap with another signal source.

In various embodiments, desired perturbation frequencies may be determined during an online learning/training phase. For example, perturbation frequency values may be determined, selected, etc. for different setups (e.g., different pulsing conditions, etc.) during an online learning/training phase. In some examples, the perturbation frequency values may be selected based on data provided by a transform, as explained herein. In this manner, a particular perturbation frequency value or values may be applied each time a specific setup is implemented in the future. Further, when new setups having different operating conditions are developed, perturbation frequency value or values may be selected for each new setup.

In various embodiments, the systems and methods herein may implement various control processes after selecting a perturbation frequency. For example, after the perturbation frequency is selected, the systems and methods herein may implement any one of the control processes/systems described in U.S. Pat. No. 10,741,363 with respect FIGS. 17-22.

Figure 12:
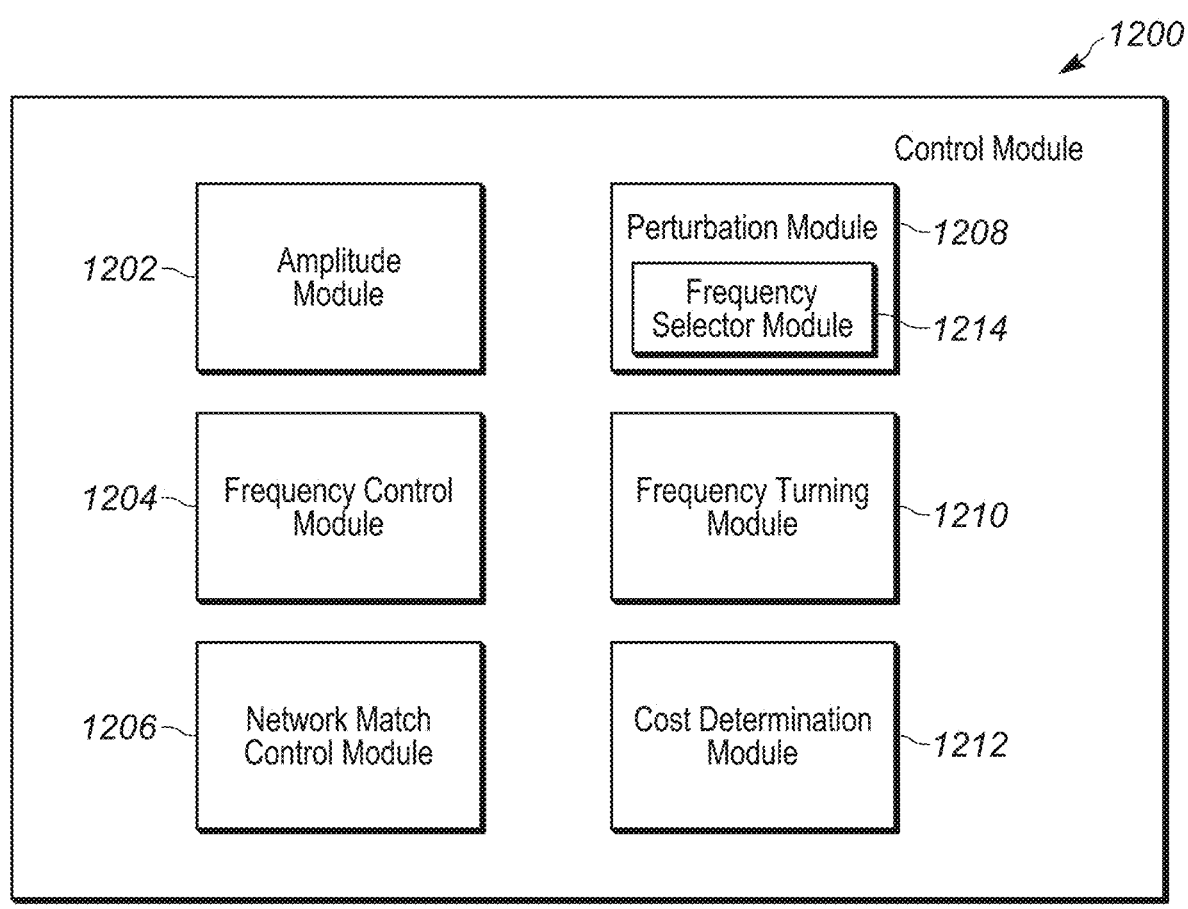
FIG. 12 shows a functional block diagram of an example control module arranged in accordance with various configurations.

FIG. 12 shows a control module 1200. Control module 1200 incorporates various components of FIGS. 1, 4 and 7. Control module 1200 may include amplitude control module 1202, frequency control module 1204, match network control module 1206, perturbation module 1208, frequency tuning module 1210, and cost determination module 1212. As shown, perturbation module 1208 includes a frequency selector module 1214. In various embodiments, control module 1200 includes one or a plurality of processors that execute code associated with the modules 1202, 1204, 1206, 1208, 1210, 1212, and 1214. Operation with one or more of the modules 1202, 1204, 1206, 1208, 1210, 1212, and 1214 is described below with respect to the method of FIGS. 13-16. Additionally, in various embodiments, operation with one or more of the modules 1202, 1204, 1206, 1208, 1210, and 1212 is described in U.S. Pat. No. 10,741,363 with respect to the methods of FIGS. 17-22.

For further defined structure of controllers 20a, 20b, and 20' of FIG. 1 and/or various control elements of FIGS. 4 and 7, see the below provided flow charts of FIGS. 13-16, flow charts of FIGS. 17-22 of U.S. Pat. No. 10,741,363, and the below provided definition for the term "module." The systems disclosed herein may be operated using numerous methods, examples, and various control system methods, some of which are illustrated in FIGS. 13-16. Although the following operations are primarily described with respect to the implementations of FIGS. 1, 4, and 7, the operations may be easily modified to apply to other implementations of the present disclosure. The operations may be iteratively performed. Although the following operations are shown and primarily described as being performed sequentially, one or more of the following operations may be performed while one or more of the other operations are being performed.

Figure 13:
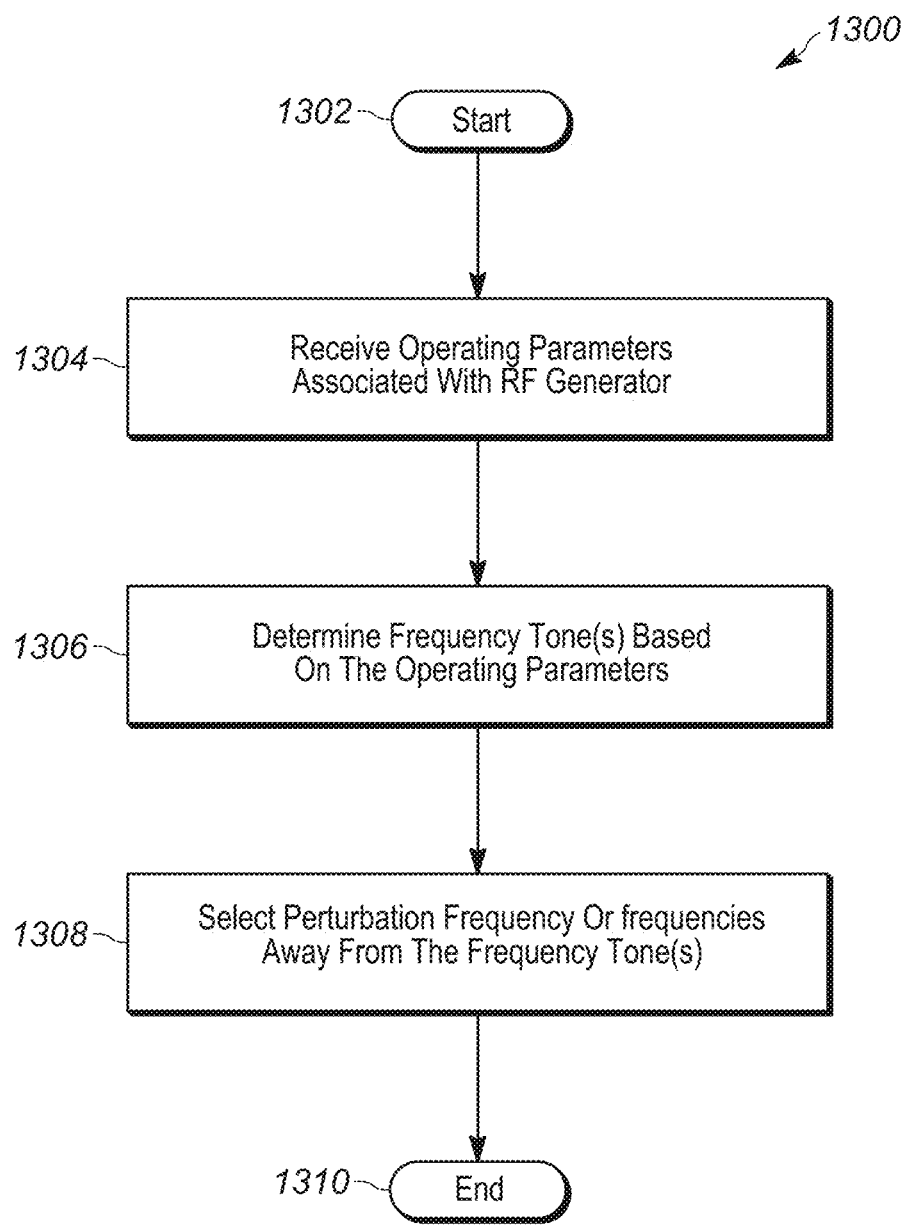
FIGS. 13-16 show flow charts of operation of control systems for perturbation frequency selection arranged in accordance with the principals of the present disclosure.

FIG. 13 shows a flow chart of a control process 1300 for perturbation frequency selection in, for example, a RF generator such as RF generator 710 of FIG. 7. Control begins at block 1302, where initialization occurs. Control proceeds to block 1304.

At block 1304, control receives operating parameters associated with the RF generator. In various embodiments, operating parameters can include a duty cycle of a state of a pulse, a repetition rate of the pulse, and a holdoff time associated with the state. In other embodiments, operating parameters may include, for example, duties cycle of multiple states of a pulse, a repetition rate of the pulse, and holdoff times associated with the states of the pulse, and/or duties cycle of multiple states of multiple pulses, repetition rates of the pulses, and holdoff times associated with the states of the multiple pulses. Control then proceeds to block 1306.

At block 1306, control determines or otherwise identifies one or more potentially interfering frequency tones. For example, potentially interfering frequency tones may be determined in accordance with any one of the manners described herein, such as by determining one or more apparent pulse frequencies, determining one or more exclusion zones associated with apparent pulse frequencies, etc. Once potentially interfering frequency tones are determined, control proceeds to block 1308.

At block 1308, control selects a suitable perturbation frequency or frequencies away from the determined frequency tone(s). In other words, control selects a suitable perturbation frequency that is sufficiently isolated from the frequency tone(s). This selection of the perturbation frequency or frequencies may be implemented in accordance with any one of the manners described herein. For example, control may select a perturbation frequency that falls within a region (e.g., a midpoint of the region) between frequency tone(s), between exclusion zones, between a frequency tone and a bandwidth limit, between DC value and a frequency tone, etc. Once control selects a perturbation frequency or frequencies at block 1308, control may proceed to block 1310 thereby ending process 1300 (as shown in FIG. 13) or return to block 1304 if desired.

Figure 14:
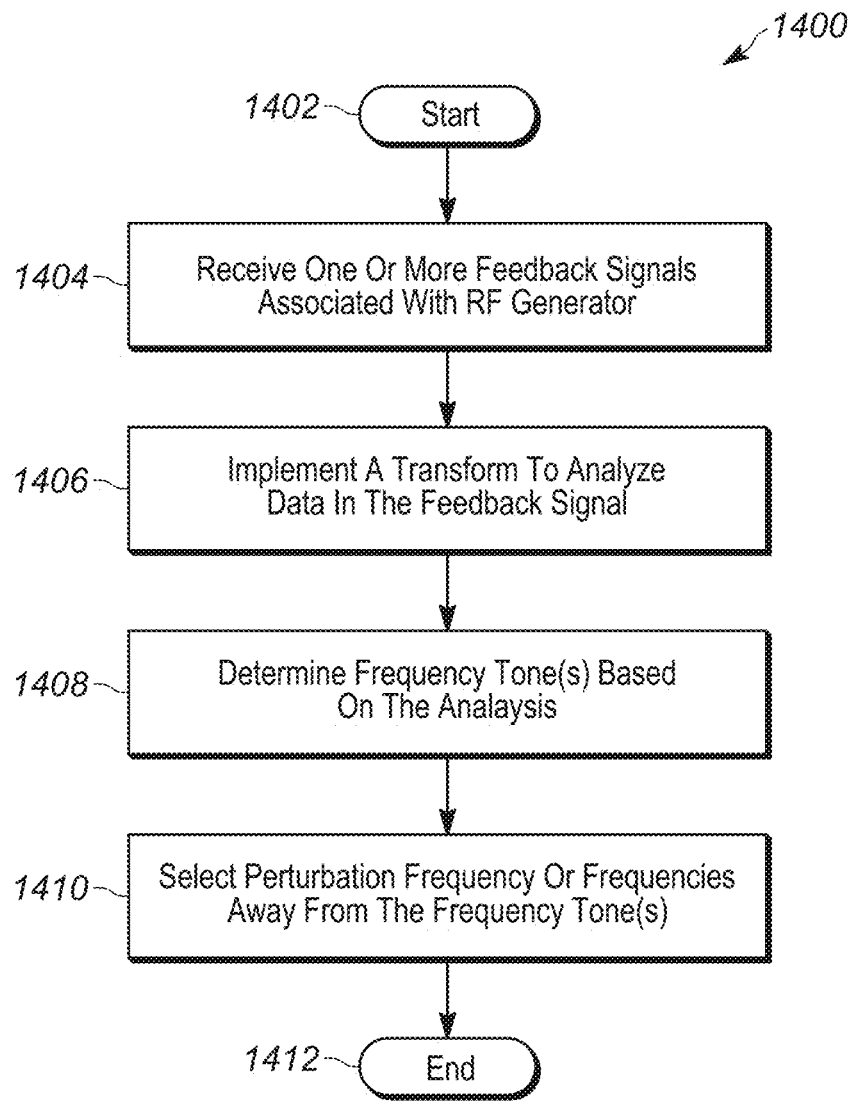

FIG. 14 shows a flow chart of another example control process 1400 for perturbation frequency selection in, for example, a RF generator such as RF generator 710 of FIG. 7. Control begins at block 1402, where initialization occurs. Control proceeds to block 1404. At block 1404, control receives one or more feedback signals associated with the RF generator. Feedback data associated with, for example, gamma mag squared, a reflective power, and/or other data of interest may be provided by or derived from the feedback signal(s). Control then proceeds to block 1406.

At block 1406, control implements a transform to analyze data in or derived from the feedback signal(s). For instance, control may implement a FFT or another suitable transform to analyze such data. Control then proceeds to block 1408.

At block 1408, control determines or otherwise identifies one or more potentially interfering frequency tones. For example, potentially interfering frequency tones may be determined in accordance with any one of the manners described herein, such as by determining frequency tones across a spectrum for an operating condition based on analyzed feedback data. Control then proceeds to block 1410.

At block 1410, control selects a suitable perturbation frequency or frequencies away from the determined frequency tone(s). This selection may be implemented in a similar manner as in block 1308 of FIG. 13. Once control selects a perturbation frequency or frequencies at block 1410, control may proceed to block 1412 thereby ending process 1400 (as shown in FIG. 14) or return to block 1404 if desired.

Figure 15:
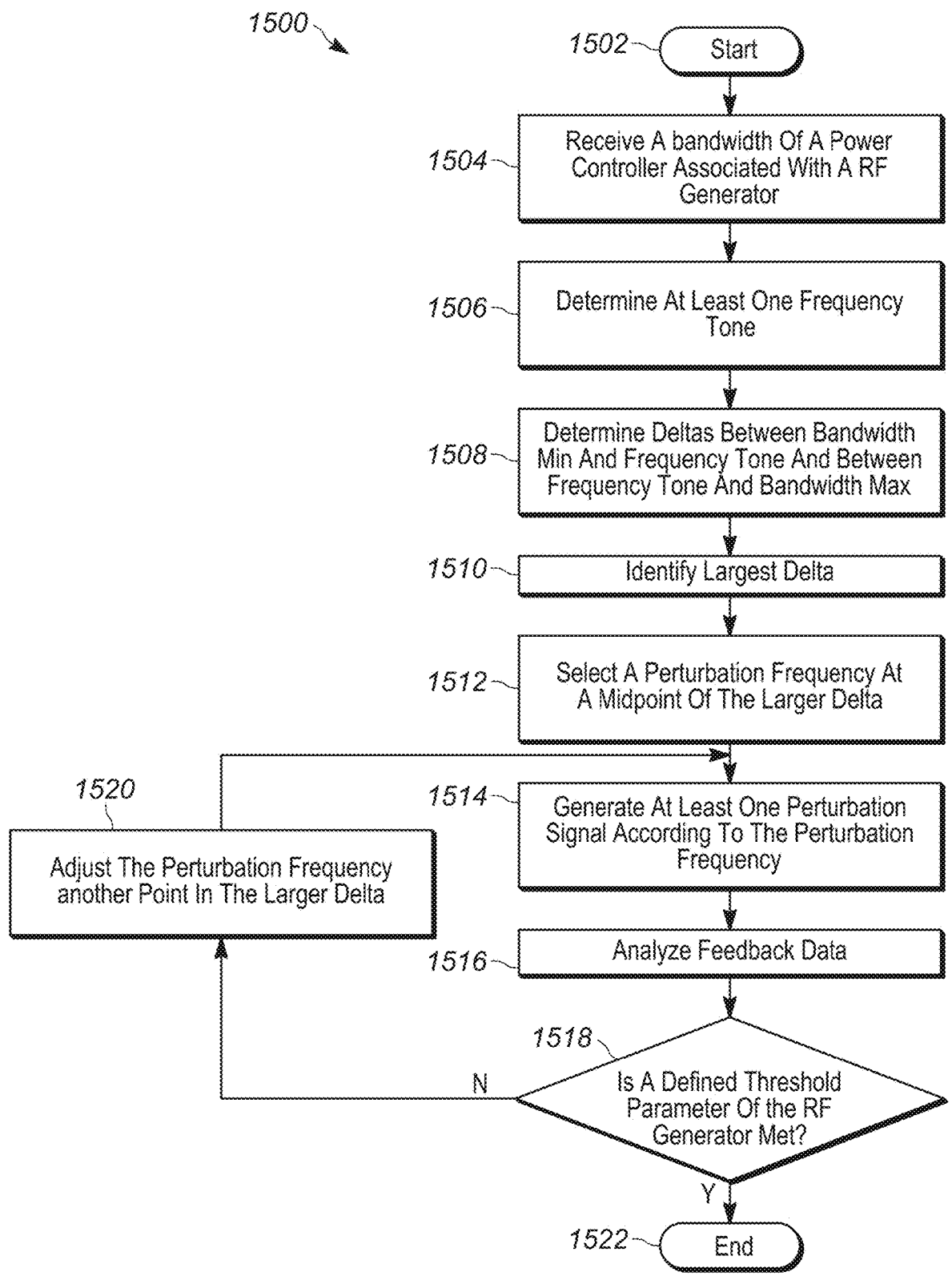

FIG. 15 shows a flow chart of another example control process 1500 for perturbation frequency selection in, for example, a RF generator such as RF generator 710 of FIG. 7. Control begins at block 1502, where initialization occurs. Control proceeds to block 1504. At block 1504, control receives or otherwise determines a bandwidth of a power controller, such as power controller 416 of FIG. 7, associated with the RF generator. Control proceeds to block 1506.

At block 1506, control determines or otherwise identifies one or more potentially interfering frequency tones. This determination of potentially interfering frequency tone(s) may be implemented in a similar manner as in blocks 1306, 1408 of FIGS. 13-14. Control proceeds to block 1508.

At block 1508, control determines deltas between a bandwidth lower limit or minimum (e.g., DC or zero Hz) and one of the frequency tones and between the same or a different frequency tone and a bandwidth upper limit or maximum. This may be done by, for example, taking a difference between the bandwidth lower limit and the frequency tone and a difference between the bandwidth upper limit and the frequency tone. Control then proceeds to block 1510, where a largest of the deltas is identified. Control then proceeds to block 1512.

At block 1512, control selects a perturbation frequency at a midpoint of the largest delta. For example, after determining the largest delta, control may divide a value of the delta by two, and then select a perturbation frequency for placement at that divided value. Alternatively, control may select a perturbation frequency at another suitable point (e.g., frequency value) within the largest delta, as explained herein. Control then proceeds to block 1514, where control generates a perturbation signal based on the selected perturbation frequency (e.g., at a midpoint or another frequency value of the largest delta). Control then proceeds to blocks 1516, 1518.

At block 1516, control analyzes feedback response data associated with the selected perturbation frequency, as explained herein. At block 1518, control determines whether the data indicates a defined threshold is met (e.g., a wiggle of the delivered power is below a defined threshold). If not, control proceeds to block 1520. If yes, control may proceed to block 1522 thereby ending process 1500 (as shown in FIG. 15) or return to block 1504 if desired.

At block 1520, control adjusts the selected perturbation frequency or selects another perturbation frequency at another point (e.g., frequency value) in the largest delta. Control then returns to block 1514.

Figure 16:
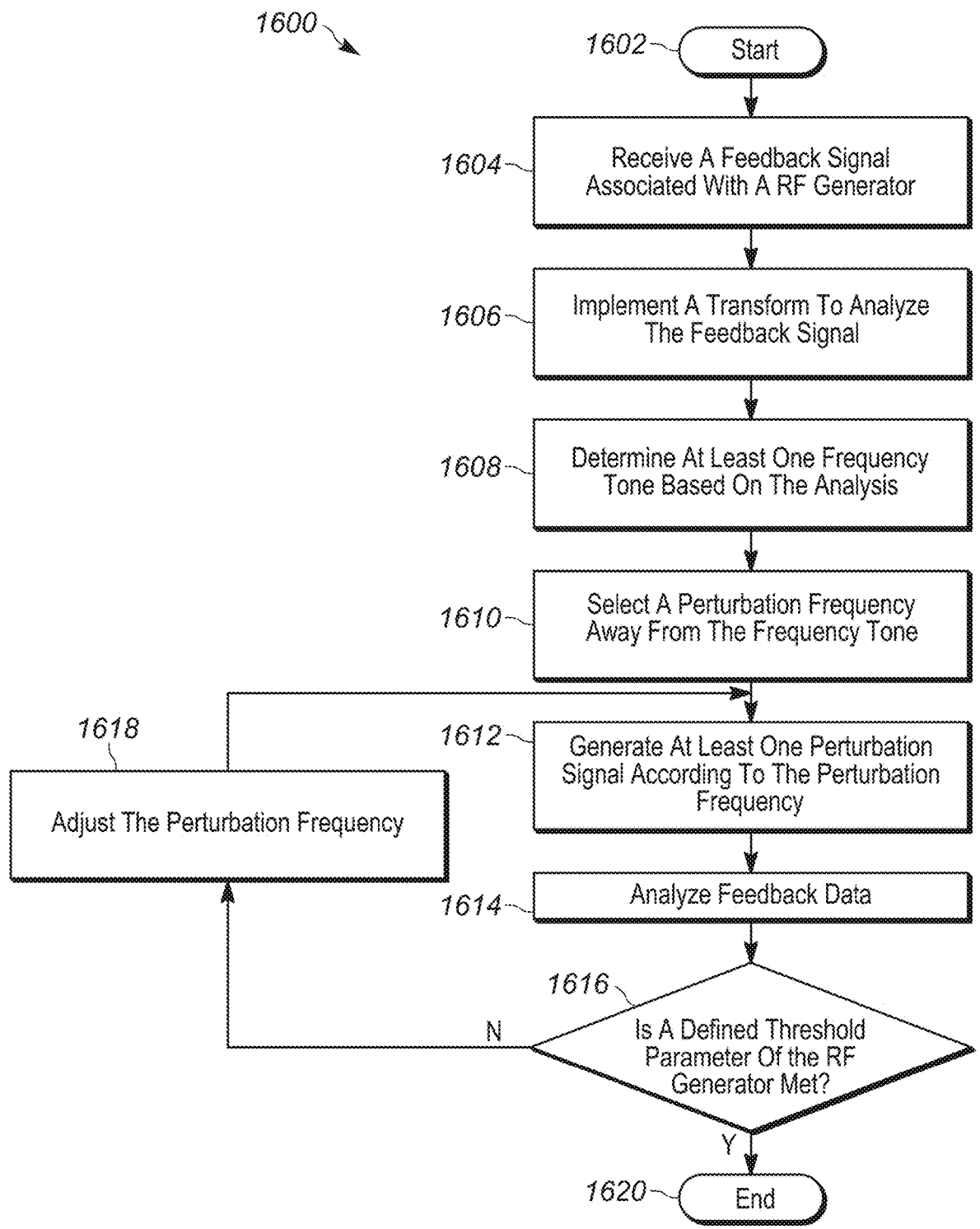

FIG. 16 shows a flow chart of another example control process 1600 for perturbation frequency selection in, for example, a RF generator such as RF generator 710 of FIG. 7. Control begins at block 1602, where initialization occurs. Control proceeds to block 1604. At block 1604, control receives one or more feedback signals associated with the RF generator, from which feedback data associated with, for example, gamma mag squared, a reflective power, and/or other data of interest may be provided by or derived. Control then proceeds to blocks 1606, 1608, 1610. At block 1606, control implements a transform to analyze data in or derived from the feedback signal(s), for example, in a similar manner as described at block 1406 of FIG. 14. At block 1608, control determines or otherwise identifies one or more potentially interfering frequency tones, for example, in a similar manner as described at block 1408 of FIG. 14. At block 1610, control selects a suitable perturbation frequency or frequencies away from the determined frequency tone(s), for example, in a similar manner as described at block 1410 of FIG. 14. Control then proceeds to blocks 1612, 1614, 1616.

At block 1612, control generates a perturbation signal based on the selected perturbation frequency. At block 1614, control analyzes feedback response data associated with the selected perturbation frequency and at block 1616, control determines whether the data indicates a defined threshold is met, for example, in a similar manner as described at blocks 1516, 1518 of FIG. 15. If the threshold is not met at block 1616, control proceeds to block 1618. Otherwise, control may proceed to block 1620 thereby ending process 1600 (as shown in FIG. 16) or return to block 1604 if desired.

At block 1618, control adjusts the selected perturbation frequency or selects another perturbation frequency at another point (e.g., frequency value) away from the determined frequency tone(s). Control then returns to block 1612.

The systems and methods described herein may, in various configurations, provide one or more of the following advantages. For example, the systems and methods described herein may enable the dynamic optimization of a perturbation frequency for ESC-based frequency tuning control. As a result, the robustness of perturbation-based signal extraction (e.g., the gradient measurement) may be improved, thereby improving ESC-based frequency tuning control with respect to known pulsing artifacts as well as other signal content that occurs in the system. Additionally, the systems and methods described herein may enable optimization across a single pulsing condition or across complete pulsing recipes. A such, the number of perturbation frequency changes required in the system may be minimized. Further, the systems and methods described herein may improve efficiencies through the online adjustment of a perturbation frequency based on current or previous operating conditions, setups, etc. as explained herein.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. In the written description and claims, one or more steps within a method may be executed in a different order (or concurrently) without altering the principles of the present disclosure. Similarly, one or more instructions stored in a non-transitory computer-readable medium may be executed in a different order (or concurrently) without altering the principles of the present disclosure. Unless indicated otherwise, numbering or other labeling of instructions or method steps is done for convenient reference, not to indicate a fixed order.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

The phrase "at least one of A, B, and C" should be construed to mean a logical (A OR B OR C), using a non-exclusive logical OR, and should not be construed to mean "at least one of A, at least one of B, and at least one of C." The term "set" does not necessarily exclude the empty set—in other words, in some circumstances a "set" may have zero elements. The term "non-empty set" may be used to indicate exclusion of the empty set—in other words, a non-empty set will always have one or more elements. The term "subset" does not necessarily require a proper subset. In other words, a "subset" of a first set may be coextensive with (equal to) the first set. Further, the term "subset" does not necessarily exclude the empty set—in some circumstances a "subset" may have zero elements.

In the figures, the direction of an arrow, as indicated by the arrowhead, generally demonstrates the flow of information (such as data or instructions) that is of interest to the illustration. For example, when element A and element B exchange a variety of information, but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" can be replaced with the term "controller" or the term "circuit." In this application, the term "controller" can be replaced with the term "module." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); processor hardware (shared, dedicated, or group) that executes code; memory hardware (shared, dedicated, or group) that stores code executed by the processor hardware; other suitable hardware components that provide the described functionality; or a combination of some or all of the above, such as in a system-on-chip.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2020 (also known as the WIFI wireless networking standard) and IEEE Standard 802.3-2018 (also known as the ETHERNET wired networking standard). Examples of a WPAN are IEEE Standard 802.15.4 (including the ZIGBEE standard from the ZigBee Alliance) and, from the Bluetooth Special Interest Group (SIG), the BLUETOOTH wireless networking standard (including Core Specification versions 3.0, 4.0, 4.1, 4.2, 5.0, and 5.1 from the Bluetooth SIG).

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module. For example, the client module may include a native or web application executing on a client device and in network communication with the server module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

The memory hardware may also store data together with or separate from the code. Shared memory hardware encompasses a single memory device that stores some or all code from multiple modules. One example of shared memory hardware may be level 1 cache on or near a microprocessor die, which may store code from multiple modules. Another example of shared memory hardware may be persistent storage, such as a solid state drive (SSD), which may store code from multiple modules. Group memory hardware encompasses a memory device that, in combination with other memory devices, stores some or all code from one or more modules. One example of group memory hardware is a storage area network (SAN), which may store code of a particular module across multiple physical devices. Another example of group memory hardware is random access memory of each of a set of servers that, in combination, store code of a particular module.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. Such apparatuses and methods may be described as computerized apparatuses and computerized methods. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Swift, Haskell, Go, SQL, R, Lisp, Java®, Fortran, Perl, Pascal, Curl, OCaml, JavaScript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A power supply system for powering a load, the power supply system comprising:
    a radio frequency (RF) power source configured to generate an output signal at an output frequency;
    a signal source configured to generate a perturbation signal;
    an extremum seeking frequency controller configured to generate a frequency control signal based on the perturbation signal, the frequency control signal varying the output frequency of the RF power source; and
    a frequency selector configured to select a perturbation frequency of the perturbation signal that is isolated from at least one frequency tone associated with the power supply system.

2. The power supply system of claim 1, further comprising a power controller coupled to the RF power source, the power controller configured to generate a pulse to modulate the output signal of the RF power source, the pulse including a first state and a second state.

3. The power supply system of claim 2, wherein:
    the perturbation frequency is a first perturbation frequency;
    the frequency selector is configured to select the first perturbation frequency for the first state of the pulse and a second perturbation frequency for the second state; and
    the first perturbation frequency and the second perturbation frequency are different.

4. The power supply system of claim 2, wherein the frequency selector is configured to select the perturbation frequency for the first state and the second state of the pulse.

5. The power supply system of claim 1, further comprising a power controller coupled to the RF power source, the power controller configured to generate at least two pulses to modulate the output signal of the RF power source, each of the at least two pulses including a first state and a second state, wherein:
    the perturbation frequency is a first perturbation frequency;
    the frequency selector is configured to select the first perturbation frequency for the first state of said each of the at least two pulses and a second perturbation frequency for the second state of said each of the at least two pulses; and
    the first perturbation frequency and the second perturbation frequency are different.

6. The power supply system of claim 1, further comprising a power controller coupled to the RF power source, the power controller configured to generate a pulse to modulate the output signal of the RF power source, wherein the frequency selector is configured to select the perturbation frequency based on a bandwidth of the power controller.

7. The power supply system of claim 6, wherein the frequency selector is configured to:
    determine a first delta between a minimum value of the bandwidth and the at least one frequency tone and a second delta between the at least one frequency tone and a maximum value of the bandwidth; and
    select the perturbation frequency to equal a frequency value within the larger of the first delta and the second delta.

8. The power supply system of claim 7, wherein the frequency value is a midpoint of the larger of the first delta and the second delta.

9. The power supply system of claim 7, wherein the frequency selector is configured to analyze data indicative of an operating parameter of the power supply system according to the selected perturbation frequency, and adjust the perturbation frequency within the larger of the first delta and the second delta if the operating parameter is below a defined threshold.

10. The power supply system of claim 9, wherein the frequency selector is configured to analyze data indicative of the operating parameter of the power supply system according to the adjusted perturbation frequency, and adjust the perturbation frequency again within the larger of the first delta and the second delta if the operating parameter is below the defined threshold.

11. The power supply system of claim 1, wherein the frequency selector is configured to determine the at least one frequency tone.

12. The power supply system of claim 11, further comprising a power controller coupled to the RF power source, the power controller configured to generate a pulse to modulate the output signal of the RF power source, wherein the at least one frequency tone includes an apparent frequency associated with a state of the pulse.

13. The power supply system of claim 12, wherein the apparent frequency is determined based on a duty cycle of the state, a repetition rate of the pulse, and a holdoff time associated with the state.

14. The power supply system of claim 12, wherein:
the state of the pulse is a first state and the apparent frequency is a first apparent frequency associated with the first state;
the at least one frequency tone includes a second apparent frequency associated with a second state of the pulse; and
the frequency selector is configured to select the perturbation frequency for the first state and the second state that is isolated from the first apparent frequency and the second apparent frequency.

15. The power supply system of claim 1, wherein the frequency selector is configured to implement a transform to analyze data of one or more feedback signals and determine the at least one frequency tone based on the analyzed data.

16. The power supply system of claim 15, wherein the frequency selector is configured to select the perturbation frequency based on the analyzed data.

17. The power supply system of claim 1, wherein the frequency selector is configured to implement a transform to analyze data of one or more feedback signals based on an output response according to the perturbation frequency.

18. The power supply system of claim 17, wherein the frequency selector is configured to adjust the perturbation frequency based on the analyzed data.

19. The power supply system of claim 17, wherein the data is indicative of an operating parameter of the power supply system, and the frequency selector is configured to adjust the perturbation frequency if the operating parameter is below a defined threshold.

20. The power supply system of claim 19, wherein the frequency selector is configured to analyze data indicative of the operating parameter of the power supply system according to the adjusted perturbation frequency, and adjust the perturbation frequency again if the operating parameter is below the defined threshold.

21. A method for controlling a radio frequency (RF) generator of a power supply system, the RF generator including a RF power source, the method comprising:
selecting a perturbation frequency of a perturbation signal that is isolated from at least one frequency tone associated with the power supply system;
generating the perturbation signal with the selected perturbation frequency; and
generating a frequency control signal based on the perturbation signal, the frequency control signal varying an output frequency of the RF power source.

22. The method of claim 21, further comprising generating a pulse to modulate an output signal of the RF power source, the pulse including a first state and a second state, wherein selecting the perturbation frequency of the perturbation signal includes selecting a first perturbation frequency for the first state of the pulse and a second perturbation frequency for the second state that is different than the first perturbation frequency.

23. The method of claim 21, further comprising generating a pulse to modulate an output signal of the RF power source, the pulse including a first state and a second state, wherein selecting the perturbation frequency of the perturbation signal includes selecting the perturbation frequency for the first state and the second state of the pulse.

24. The method of claim 21, further comprising generating at least two pulses to modulate an output signal of the RF power source, each of the at least two pulses including a first state and a second state, wherein selecting the perturbation frequency of the perturbation signal includes selecting a first perturbation frequency for the first state of said each of the at least two pulses and a second perturbation frequency for the second state of said each of the at least two pulses that is different than the first perturbation frequency.

25. The method of claim 21, further comprising generating, with a power controller, a pulse to modulate an output signal of the RF power source, wherein selecting the perturbation frequency of the perturbation signal includes selecting the perturbation frequency based on a bandwidth of the power controller.

26. The method of claim 25, further comprising determining a first delta between a minimum value of the bandwidth and the at least one frequency tone and a second delta between the at least one frequency tone and a maximum value of the bandwidth, wherein selecting the perturbation frequency of the perturbation signal includes selecting the perturbation frequency to equal a frequency value within the larger of the first delta and the second delta.

27. The method of claim 26, wherein the frequency value is a midpoint of the larger of the first delta and the second delta.

28. The method of claim 26, further comprising analyzing data indicative of an operating parameter of the power supply system according to the selected perturbation frequency, and adjusting the perturbation frequency within the larger of the first delta and the second delta if the operating parameter is below a defined threshold.

29. The method of claim 28, further comprising analyzing data indicative of the operating parameter of the power supply system according to the adjusted perturbation frequency, and adjusting the perturbation frequency again within the larger of the first delta and the second delta if the operating parameter is below the defined threshold.

30. The method of claim 21, further comprising determining the at least one frequency tone.

31. The method of claim 30, wherein the at least one frequency tone includes an apparent frequency associated with a state of a pulse.

32. The method of claim 31, wherein determining the at least one frequency tone includes determining the apparent frequency associated with the state of the pulse based on a duty cycle of the state, a replication rate of the pulse, and a holdoff time associated with the state.

33. The method of claim 31, wherein:
the state of the pulse is a first state and the apparent frequency is a first apparent frequency associated with the first state;
the at least one frequency tone includes a second apparent frequency associated with a second state of the pulse; and
selecting the perturbation frequency of the perturbation signal includes selecting the perturbation frequency for the first state and the second state that is isolated from the first apparent frequency and the second apparent frequency.

34. The method of claim 21, further comprising implementing a transform to analyze data of one or more feedback signals, and determining the at least one frequency tone based on the analyzed data.

35. The method of claim 34, wherein selecting the perturbation frequency of the perturbation signal includes selecting the perturbation frequency based on the analyzed data.

36. The method of claim 21, further comprising implementing a transform to analyze data of one or more feedback signals based on an output response according to the perturbation frequency.

37. The method of claim 36, further comprising adjusting the perturbation frequency based on the analyzed data.

38. The method of claim 36, wherein:
the data is indicative of an operating parameter of the power supply system; and
the method further comprises adjusting the perturbation frequency if the operating parameter is below a defined threshold.

39. The method of claim 38, further comprising analyzing data indicative of the operating parameter of the power supply system according to the adjusted perturbation frequency, and adjusting the perturbation frequency again if the operating parameter is below the defined threshold.

40. A non-transitory computer-readable medium storing processor-executable instructions for controlling a radio frequency (RF) generator of a power supply system, the RF generator including a RF power source, the instructions comprising:
selecting a perturbation frequency of a perturbation signal that is isolated from at least one frequency tone associated with the power supply system;
generating the perturbation signal with the selected perturbation frequency; and
generating a frequency control signal based on the perturbation signal, the frequency control signal varying an output frequency of the RF power source.

41. The non-transitory computer-readable medium storing processor-executable instructions of claim 40, the instructions further comprising generating, with a power controller, a pulse to modulate an output signal of the RF power source, wherein selecting the perturbation frequency of the perturbation signal includes selecting the perturbation frequency based on a bandwidth of the power controller.

42. The non-transitory computer-readable medium storing processor-executable instructions of claim 41, the instructions further comprising determining a first delta between a minimum value of the bandwidth and the at least one frequency tone and a second delta between the at least one frequency tone and a maximum value of the bandwidth, wherein selecting the perturbation frequency of the perturbation signal includes selecting the perturbation frequency to equal a frequency value within the larger of the first delta and the second delta.

43. The non-transitory computer-readable medium storing processor-executable instructions of claim 42, wherein the frequency value is a midpoint of the larger of the first delta and the second delta.

44. The non-transitory computer-readable medium storing processor-executable instructions of claim 42, the instructions further comprising analyzing data indicative of an operating parameter of the power supply system according to the selected perturbation frequency, and adjusting the perturbation frequency within the larger of the first delta and the second delta if the operating parameter is below a defined threshold.

45. The non-transitory computer-readable medium storing processor-executable instructions of claim 44, the instructions further comprising analyzing data indicative of the operating parameter of the power supply system according to the adjusted perturbation frequency, and adjusting the perturbation frequency again within the larger of the first delta and the second delta if the operating parameter is below the defined threshold.

46. The non-transitory computer-readable medium storing processor-executable instructions of claim 40, the instructions further comprising determining the at least one frequency tone.

47. The non-transitory computer-readable medium storing processor-executable instructions of claim 46, wherein:
the at least one frequency tone includes an apparent frequency associated with a state of a pulse; and
determining the at least one frequency tone includes determining the apparent frequency associated with the state of the pulse based on a duty cycle of the state, a replication rate of the pulse, and a holdoff time associated with the state.

48. The non-transitory computer-readable medium storing processor-executable instructions of claim 46, wherein:
the at least one frequency tone includes a first apparent frequency associated with a first state of a pulse and a second apparent frequency associated with a second state of the pulse; and
selecting the perturbation frequency of the perturbation signal includes selecting the perturbation frequency for the first state and the second state that is isolated from the first apparent frequency and the second apparent frequency.

49. The non-transitory computer-readable medium storing processor-executable instructions of claim 40, the instructions further comprising implementing a transform to analyze data of one or more feedback signals based on an output response according to the perturbation frequency, the data indicative of an operating parameter of the power supply system, and adjusting the perturbation frequency if the operating parameter is below a defined threshold.

50. The non-transitory computer-readable medium storing processor-executable instructions of claim 49, the instructions further comprising analyzing data indicative of the operating parameter of the power supply system according to the adjusted perturbation frequency, and adjusting the perturbation frequency again if the operating parameter is below the defined threshold.

51. A control system for controlling a radio frequency (RF) generator of a power supply system, the RF generator including a RF power source configured to generate an output signal at an output frequency, the control system comprising:
a signal source configured to generate a perturbation signal;
an extremum seeking frequency controller configured to generate a frequency control signal based on the perturbation signal, the frequency control signal varying the output frequency of the RF power source; and
a frequency selector configured to select a perturbation frequency of the perturbation signal that is isolated from at least one frequency tone associated with the power supply system.

52. The control system of claim 51, further comprising a power controller configured to generate a pulse to modulate the output signal of the RF power source, the pulse including a first state and a second state, wherein:
- the perturbation frequency is a first perturbation frequency;
- the frequency selector is configured to select the first perturbation frequency for the first state of the pulse and a second perturbation frequency for the second state; and
- the first perturbation frequency and the second perturbation frequency are different.

53. The control system of claim 51, further comprising a power controller configured to generate a pulse to modulate the output signal of the RF power source, the pulse including a first state and a second state, wherein the frequency selector is configured to select the perturbation frequency for the first state and the second state of the pulse.

54. The control system of claim 51, further comprising a power controller configured to generate at least two pulses to modulate the output signal of the RF power source, each of the at least two pulses including a first state and a second state, wherein:
- the perturbation frequency is a first perturbation frequency;
- the frequency selector is configured to select the first perturbation frequency for the first state of said each of the at least two pulses and a second perturbation frequency for the second state of said each of the at least two pulses; and
- the first perturbation frequency and the second perturbation frequency are different.

55. The control system of claim 51, further comprising a power controller configured to generate a pulse to modulate the output signal of the RF power source, wherein the frequency selector is configured to select the perturbation frequency based on a bandwidth of the power controller.

56. The control system of claim 55, wherein the frequency selector is configured to:
- determine a first delta between a minimum value of the bandwidth and the at least one frequency tone and a second delta between the at least one frequency tone and a maximum value of the bandwidth; and
- select the perturbation frequency to equal a frequency value within the larger of the first delta and the second delta.

57. The control system of claim 51, wherein the frequency selector is configured to determine the at least one frequency tone.

58. The control system of claim 57, wherein the frequency selector is configured to implement a transform to analyze data of one or more feedback signals, determine the at least one frequency tone based on the analyzed data, and select the perturbation frequency based on the at least one frequency tone.

59. The control system of claim 51, wherein the frequency selector is configured to implement a transform to analyze data of one or more feedback signals based on an output response according to the perturbation frequency, and adjust the perturbation frequency based on the analyzed data.

60. The control system of claim 59, wherein:
- the data is indicative of an operating parameter of the power supply system; and
- the frequency selector is configured to adjust the perturbation frequency if the operating parameter is below a defined threshold.

* * * * *